United States Patent
Totzeck et al.

(10) Patent No.: US 8,031,326 B2
(45) Date of Patent: Oct. 4, 2011

(54) ILLUMINATION SYSTEM OR PROJECTION LENS OF A MICROLITHOGRAPHIC EXPOSURE SYSTEM

(75) Inventors: Michael Totzeck, Schwaebisch Gmuend (DE); Susanne Beder, Aalen (DE); Wilfried Clauss, Tuebingen (DE); Heiko Feldmann, Aalen (DE); Daniel Kraehmer, Essingen (DE); Aurelian Dodoc, Heidenheim (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 698 days.

(21) Appl. No.: 12/042,621

(22) Filed: Mar. 5, 2008

(65) Prior Publication Data

US 2008/0204877 A1 Aug. 28, 2008

Related U.S. Application Data

(63) Continuation of application No. PCT/EP2006/066332, filed on Sep. 13, 2006.

(60) Provisional application No. 60/717,576, filed on Sep. 14, 2005.

(51) Int. Cl.
*G03B 27/54* (2006.01)
*G03B 27/72* (2006.01)

(52) U.S. Cl. ............................ 355/67; 355/71
(58) Field of Classification Search .............. 355/67, 355/53, 71
See application file for complete search history.

(56) References Cited

U.S. PATENT DOCUMENTS

| 6,191,880 B1 | 2/2001 | Schuster |
| 6,252,712 B1 | 6/2001 | Furter et al. |
| 6,970,232 B2 * | 11/2005 | McGuire, Jr. ................. 355/71 |

(Continued)

FOREIGN PATENT DOCUMENTS

EP  1 355 180 A2  10/2003

(Continued)

OTHER PUBLICATIONS

Office action in Chinese Application No. 2006800339207 (Chinese counterpart to U.S. Appl. No. 12/042,621), dated May 2, 2010.

(Continued)

*Primary Examiner* — Peter B Kim
(74) *Attorney, Agent, or Firm* — Fish & Richardson P.C.

(57) ABSTRACT

In some embodiments, the disclosure provides an optical system, in particular an illumination system or a projection lens of a microlithographic exposure system, having an optical system axis and at least one element group including three birefringent elements each of which includes optically uniaxial material and having an aspheric surface, wherein a first birefringent element of the group has a first orientation of its optical crystal axis, a second birefringent element of the group has a second orientation of its optical crystal axis, wherein the second orientation can be described as emerging from a rotation of the first orientation, the rotation not corresponding to a rotation around the optical system axis by an angle of 90° or an integer multiple thereof, and a third birefringent element of the group has a third orientation of its optical crystal axis, wherein the third orientation can be described as emerging from a rotation of the second orientation, the rotation not corresponding to a rotation around the optical system axis by an angle of 90° or an integer multiple thereof.

35 Claims, 19 Drawing Sheets

U.S. PATENT DOCUMENTS

| | | |
|---|---|---|
| 2003/0086156 A1 | 5/2003 | McGuire |
| 2003/0137733 A1* | 7/2003 | Gerhard et al. ............... 359/494 |
| 2004/0105170 A1 | 6/2004 | Krahmer et al. |
| 2004/0179272 A1 | 9/2004 | Gerhard et al. |
| 2004/0263814 A1* | 12/2004 | Unno ............................ 355/67 |
| 2005/0146798 A1 | 7/2005 | Kraehmer et al. |
| 2006/0056064 A1 | 3/2006 | Shafer |
| 2007/0183017 A1 | 8/2007 | Hembd |

FOREIGN PATENT DOCUMENTS

| | | |
|---|---|---|
| EP | 1 681 710 | 7/2006 |
| JP | 05 045519 A | 2/1993 |
| WO | WO 02/093209 A2 | 11/2002 |
| WO | WO 2005/001527 A1 | 1/2005 |
| WO | WO 2005/059645 A2 | 6/2005 |

OTHER PUBLICATIONS

J. Burnett et al., "High-index materials for 193nm immersion lithography," Proceedings of the SPIE, Bellingham, VA, vol. 5754, Mar. 1, 2005; pp. 611-621.

Hecht, Optics, Pearson Education Inc., Fourth Edition, 342, 2002.

Office Action in Chinese Application No. 2006800339207 (Chinese counterpart to U.S. Appl. No. 12/042,621), and English translation thereof, dated Sep. 30, 2010.

* cited by examiner a)

b)

a)

b)

c)

a)

b)

a)

— 1.1 waves b)

— 2.3 waves

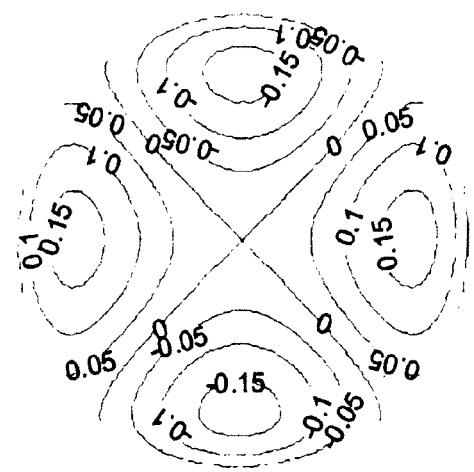
c)
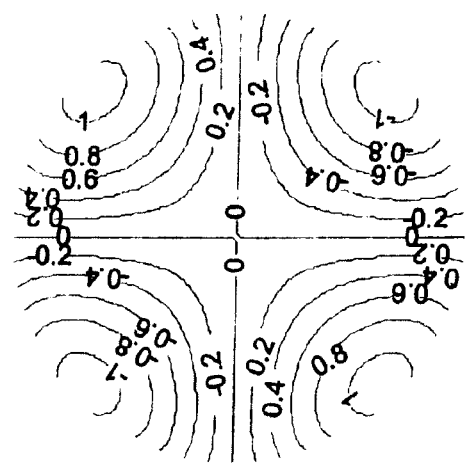
b)
Fig. 13
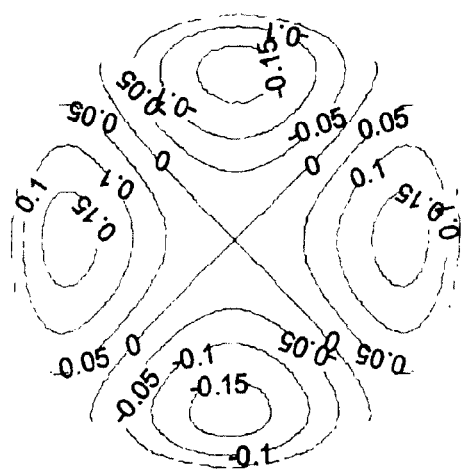
a)

ILLUMINATION SYSTEM OR PROJECTION LENS OF A MICROLITHOGRAPHIC EXPOSURE SYSTEM

CROSS-REFERENCE TO RELATED APPLICATIONS

The present application is a continuation of PCT/EP2006/066332, filed Sep. 13, 2006, which claims benefit of U.S. Ser. No. 60/717,576, filed Sep. 14, 2005. The contents of PCT/EP2006/066332 are hereby incorporated by reference.

FIELD

The present disclosure relates to an optical system, such as an illumination system or a projection lens of a microlithographic exposure system.

BACKGROUND

Microlithography is used in the fabrication of microstructured components like integrated circuits, LCD's and other microstructured devices. The microlithographic process is performed in a so-called microlithographic exposure system including an illumination system and a projection lens. The image of a mask (or reticle) being illuminated by the illumination system is projected, through the projection lens, onto a resist-covered substrate, typically a silicon wafer bearing one or more light-sensitive layers and being provided in the image plane of the projection lens, in order to transfer the circuit pattern onto the light-sensitive layers on the wafer.

In order to obtain a good interference contrast of the image created in the image plane of the projection lens, it can be advantageous to have a two-beam-interference of light rays each being polarized perpendicular to the plane of incidence. It can be desirable to have a so-called tangential polarization distribution, where the planes of oscillation of the electrical field vectors of individual linearly polarized light rays in a pupil plane of the system have an orientation that is perpendicular to the radius originating from the optical axis.

SUMMARY

Attempts to enhance the resolution and the optical performance of microlithographic exposure systems can lead to an increasing desire for use of optical components including materials with relatively high refractive index. Herein, a refractive index is regarded as "high" if its value exceeds, at the used wavelength, the refractive index of $SiO_2$ which is $n \approx 1.56$ at 193 nm. Such materials are, for example, spinelle ($n \approx 1.87$ at 193 nm), sapphire ($n \approx 1.93$ at 193 nm) or magnesium oxide ($n \approx 2.02$ at 193 nm). However, problems can arise from the fact that these materials exhibit the effect of either uniaxial birefringence (e.g., sapphire, being optically uniaxial with $\Delta n \approx -0.01$ at 193 nm) or intrinsic birefringence ("IBR", e.g., spinelle with an IBR of $\approx 52$ nm/cm at 193 nm or magnesium oxide with an IBR of $\approx 70$ nm/cm at 193 nm, or garnets $(M1)_3(M2)_7O_{12}$ with M1 for instance Y, Sc or Lu, with M2 for instance Al, Ga, In or Tl, and an IBR in a range between 20 nm/cm and 80 nm/cm), causing a retardation that disturbs the polarization distribution of the transmitted rays. Further disturbances can arise, for example, from stress birefringence in the used optical components, phase shifts occurring at reflecting boundaries etc.

Accordingly, countermeasures are desirable to at least partially compensate for such disturbances.

In some embodiments, the present disclosure provides an optical system, such as an illumination system or a projection lens of a microlithographic exposure system, wherein an arbitrary desired polarization distribution can be effectively created with a simple structure that can be fabricated with a high precision in compliance with the what is desired for microlithographic exposure systems. More particularly, the present disclosure provides an optical system wherein local disturbances of the state of polarization, in particular due the presence of one or more optical elements having a relatively high refractive index and relatively strong birefringence (e.g., due to the presence of uniaxial materials or of materials showing strong intrinsic birefringence), can be effectively compensated. As a further aspect, the present disclosure provides an optical system wherein a first (e.g., circular or linear) polarization distribution is transformed into a second (e.g., tangential) polarization distribution.

An optical system, in particular an illumination system or a projection lens of a microlithographic exposure system, according to one aspect of the present disclosure has an optical system axis and at least one element group including three birefringent elements each of which including optically uniaxial material and having an aspheric surface, wherein:
a first birefringent element of the group has a first orientation of its optical crystal axis;
a second birefringent element of the group has a second orientation of its optical crystal axis, wherein the second orientation can be described as emerging from a rotation of the first orientation, the rotation not corresponding to a rotation around the optical system axis by an angle of 90° or an integer multiple thereof; and
a third birefringent element of the group has a third orientation of its optical crystal axis, wherein the third orientation can be described as emerging from a rotation of the second orientation, the rotation not corresponding to a rotation around the optical system axis by an angle of 90° or an integer multiple thereof.

In the meaning of the present disclosure, the term "birefringent" or "birefringent element" shall include both linear birefringence and circular birefringence (i.e. optical activity, as observed, e.g., in crystalline quartz).

In some embodiments, the three birefringent elements of the element group are consecutive in such a sense that the second birefringent element is, along the optical system axis or in the light propagation direction, the next birefringent optical element following to the first element, and that the third birefringent element is, along the optical system axis or in the light propagation direction, the next birefringent optical element following to the second element. With other words, the elements of the group are arranged in the optical system in succession or in mutually adjacent relationship along the optical system axis. Furthermore, the three elements can be directly adjacent to each other without any (birefringent or nonbirefringent) optical element in between.

According to the present disclosure, a combination of three birefringent elements is used for achieving a desired compensation of local disturbances of the state of polarization, wherein each of the elements has an aspheric surface and thus a varying strength in its birefringent effect resulting from its thickness profile. The disclosure is involves the realization that with such a combination of three elements with suitable variations of the thickness profiles and orientations of the respective crystal axes, it is principally possible to achieve any desired distribution of the retardation, which again may be used to at least partially compensate an existing distribution of the retardation due the presence of one or more optical elements in the optical system showing strong retardation caused for instance by using uniaxial media, biaxial media, media with intrinsic birefringence or media with stress induced birefringence.

As to the theoretical considerations underlying the present disclosure, a non-absorbing (=unitary) Jones matrix having the general form $$J = \begin{pmatrix} A & B \\ -B^* & A^* \end{pmatrix} = \begin{pmatrix} a_0 + ia_1 & a_2 + ia_3 \\ -a_2 + ia_3 & a_0 - ia_1 \end{pmatrix} \quad (1)$$

with $$\sum_{j=0}^{3} a_j^2 = 1$$

can be described by a rotation of the Poincaré-sphere, wherein points lying on the surface of the Poincaré-sphere are describing specific states of polarization. The concept of the present disclosure involves the fact that the rotation of the Poincaré-sphere can be divided into elementary rotations, which again are corresponding to specific Jones-matrices. The suitable combination of three of such Jones-matrices is used to describe a desired rotation of the Poincaré-sphere, i.e. a desired non-absorbing (=unitary) Jones matrix.

In other words, any unitary Jones matrix can be expressed as a matrix product of three matrix functions, $$J = R_1(\alpha) \cdot R_2(\beta) \cdot R_3(\gamma) \quad (2)$$

with a suitable choice of the "Euler angles" $\alpha$, $\beta$, and $\gamma$. Each of the matrix functions $R_1(\alpha)$, $R_2(\alpha)$, $R_3(\alpha)$ is taken from the set $$\left\{ \begin{pmatrix} \cos\alpha & -\sin\alpha \\ \sin\alpha & \cos\alpha \end{pmatrix}, \begin{pmatrix} \exp(-i\alpha) & 0 \\ 0 & \exp(i\alpha) \end{pmatrix}, \begin{pmatrix} \cos\alpha & -i\sin\alpha \\ -i\sin\alpha & \cos\alpha \end{pmatrix} \right\}$$

which describes a rotator, a retarder with 0° orientation and a retarder with 45° orientation, the strength of which are specified by $\alpha$. This decomposition of any unitary Jones matrix is always possible under the condition that $$R_1(\alpha) \neq R_2(\alpha) \text{ and } R_2(\alpha) \neq R_3(\alpha) \quad (3)$$

The above feature that, in the element group of three birefringent elements according to the present disclosure, the orientation of the optical crystal axis in the second (or third, respectively) birefringent element can be described as emerging from a rotation of the orientation of the optical crystal axis in the first (or second, respectively) birefringent element by an angle not corresponding to 90° or an integer multiple thereof guarantees the independency of the three birefringent elements in the above sense. This considers the fact that two elements each having an aspheric surface and such an orientation of their optical crystal axis, that the two orientations of these two elements are rotated by, e.g., an angle of 90° to each other, are in so far not independent in their polarizing effect as one of these elements can be substituted by the other if, at the same time, the sign of the respective aspheric surface (or the thickness profile) is inverted.

With other words, the element group according to the present disclosure includes three birefringent elements, wherein two subsequent birefringent elements of the optical group according to the present disclosure have different orientations of their optical crystal axis. Further, two such orientations are only regarded as being different from each other if one of these orientations cannot achieved by a rotation around the optical system axis by an angle of 90° (or an integer multiple thereof).

With still other words, the orientations of two subsequent birefringent elements of the optical group according to the present disclosure should be, in deciding whether they are really different in their polarizing effect, compared to each other "modulo 90°". Accordingly, in a different wording the present aspect of the disclosure may be defined in that if the optical crystal axes of two subsequent birefringent elements of the optical group are lying in a plane perpendicular to the optical system axis, the "angle modulo 90°" between the two orientations of these optical crystal axes is not zero. As an example, two orientations lying in a plane perpendicular to the optical system axis with an angle of 90° to each other are regarded, according to the present disclosure, as equal or as not independent, whereas two orientations lying in a plane perpendicular to the optical system axis with an angle of 95° to each other yield an angle of "95° modulo 90°"=5° and thus are regarded as not equal or as independent from each other.

If a bundle of light rays passes such an element group of three birefringent elements whose optical crystal axes meet the above criterion, it becomes possible to compensate, for suitable selections of the aspheric surfaces or thickness profiles of these birefringent elements, any disturbance of the polarization distribution in the optical system, e.g., projection lens of a microlithography exposure system.

Generally, in order to provide at a predetermined position a predetermined phase retardation of $\Delta\phi$, a thickness d is used as given by $$d = \frac{\lambda \Delta\varphi}{2\pi \Delta n} \quad (4)$$

In the context of the present disclosure a significant compensation of birefringent effects in a projection lens will typically should correspond to a retardance of at least $\lambda \cdot \Delta\phi \gtrsim 5$ nanometers (nm). In order to provide such a compensation, the variation $\Delta d$ of the thickness due to the aspheric surface corresponding to such a retardance effect will, for a typical value of $\Delta n$ for, e.g., $MgF_2$ of 0.0024 and a typical wavelength of $\lambda \approx 193$ nm, amount to $\Delta d \approx 5$ nm/$(2 \cdot \pi \cdot \Delta n) \approx 331$ nm. Accordingly, the lower limit for a typical quantitative level of the thickness profile variation in the aspheric surfaces can be estimated, for a wavelength of $\lambda \approx 193$ nm, to $\Delta d_{min} \approx 0.3$ μm. In terms of the achieved phase retardation $\Delta\phi$, a lower limit $\Delta\phi_{min}$ corresponding to a significant compensation of birefringent effects can be given by the criterion $\Delta\phi > (5$ nm/193 nm), so that a lower limit $\Delta\phi_{min}$ of the phase retardation can be estimated as $\Delta\phi_{min} \approx 0.025$ or $\Delta\phi_{min} \approx 25$ mrad. Therefore, according to an embodiment of the disclosure, each of the birefringent elements has such a variation of its thickness profile that a minimum phase retardation of $\Delta\phi_{min} \approx 25$ mrad is obtained at a given operating wavelength of the optical system.

According to an embodiment of the disclosure, the optical crystal axes of all of the three birefringent elements are oriented different from each other. Such an arrangement enables to realize the above concept of the three crystal orientations in configurations where the first and third birefringent element have their crystal axes oriented perpendicular to each other. This is advantageous in so far, as in case if the desired polarization effect to be compensated (i.e. to be provided by the element group) is an at least almost pure retardance (without or with only a small amount of elliptical components), the respective aspheric surfaces of the first and third element may have aspheric surfaces of substantially identical height profiles with opposite signs, leading to an at least partial compensation of the scalar effects of these surfaces.

According to a further embodiment of the disclosure, the optical crystal axes of the first birefringent element and the third birefringent element are substantially parallel to each other. Such an arrangement favours to manufacture these two elements with identical aspheric surfaces or height profiles, which is favourable with respect to a significant simplification of the manufacturing process and the use of identical test optics for these elements.

According to a further embodiment of the disclosure, the optical crystal axes of all three birefringent elements are oriented perpendicular to the optical system axis, wherein the optical crystal axes of the first birefringent element and the third birefringent element are each rotated around the optical system axis with respect to the optical crystal axis of the second birefringent element of the group by an angle in the range of 30° to 60° (e.g., in the range of 40° to 50°, 45°). This is advantageous in so far as the respective elements having their optical crystal axes oriented under an angle of 45° correspond to rotations of the Poincaré-sphere around axes being perpendicular to each other, i.e. linearly independent rotations, which makes it possible to achieve a specific desired compensation effect with a more moderate height profile and smaller surface deformation.

In certain embodiments, an optical crystal axis in each of the optical elements is either substantially perpendicular or substantially parallel to the optical system axis. Here and in the following, the wording that the optical crystal axis is either "substantially perpendicular" or "substantially parallel" to the optical system axis shall express that small deviations of the exact perpendicular or parallel orientation are covered by the present disclosure, wherein a deviation is regarded as small if the angle between the optical crystal axis and the respective perpendicular or parallel orientation does not exceed ±5°.

According to an embodiment of the disclosure, the birefringent elements have on average essentially no refracting power. This wording is to be understood, in the meaning of the present disclosure, such that in case of an approximation of the surfaces of the respective element by a best-fitting spherical surface, the refractive power of the so approximated element is not more than 1 diopter (1 Dpt=1 m$^{-1}$). The property of the birefringent elements to have "on average essentially no refracting power" may be alternatively achieved by an additional compensation plate for one or more of the optical elements or may already result from the surface relief of the respective element being only marginal, i.e. being essentially similar to a plane-parallel plate. According to one embodiment, the compensation plate may include a non-birefringent material, e.g., fused silica.

According to a further aspect of the disclosure, an optical system, in particular an illumination system or a projection lens of a microlithographic exposure system, has an optical system axis and at least one element group including three element pairs each of which includes one birefringent element and one attributed compensation element, the birefringent element including optically uniaxial material and having an aspheric surface, wherein each birefringent element and the attributed compensation element supplement each other to a plan-parallel geometry of the element pair, wherein:

a first birefringent element of the group has a first orientation of its optical crystal axis;

a second birefringent element of the group has a second orientation of its optical crystal axis, wherein the second orientation can be described as emerging from a rotation of the first orientation, the rotation not corresponding to a rotation around the optical system axis by an angle of 90° or an integer multiple thereof; and a third birefringent element of the group has a third orientation of its optical crystal axis, wherein the third orientation can be described as emerging from a rotation of the second orientation, the rotation not corresponding to a rotation around the optical system axis (OA) by an angle of 90° or an integer multiple thereof.

Accordingly, the optical system or the optical element group in this aspect are analogous to optical system or the optical element group described before and differ only in so far as the element group includes for each of the birefringent elements an attributed compensation element such that the birefringent element and the attributed compensation element add up to a plan-parallel geometry. The advantageous effect additionally achieved in this aspect is that a detrimental influence of the element group on the so-called scalar phase can be kept low and, in the ideal case, made equal to the effect caused by a plan-parallel plate on the scalar phase. The compensation element can also include an optically uniaxial material having an optical crystal axis which is oriented in the plane perpendicular to the optical system axis and oriented perpendicular to the optical crystal axis of the attributed birefringent element. As to embodiments and advantages of the optical system or the optical element group in this aspect, reference can be made to the embodiments and advantages mentioned and discussed with respect to the optical system or the optical element group according to the first aspect.

In some embodiments, the combined element or the element group is arranged in a pupil plane of the optical system.

This arrangement is advantageous in so far as light beams entering the image-sided last lens element of the projection lens under the same angle (and therefore are subjected to a birefringence of similar strength) are passing the element group or the combined element, respectively, at substantially the same position and will be identically compensated with regard to their polarization state.

In certain embodiments, the combined element or the element group is arranged at a position where the relation $$0.8 < \frac{D_1}{D_2} < 1.0$$

is met, with $D_1$ being a diameter of a light bundle at the position and $D_2$ being a total optically used diameter at the position.

This arrangement is advantageous in view of the improved compensation which may be obtained in case of a field-dependency of the polarization effect caused by the image-sided last lens element (due to different geometrical path length within the last lens element belonging to different field positions of the light beams), since the field dependency can be better considered with a displacement of the element group or combined element respectively, with respect to the pupil plane.

In some embodiments, the optical system includes at least two combined elements or element groups, which are both arranged at a position where the relation $$0.5 \leq \frac{D_1}{D_2} \leq 1.0$$

is met, with $D_1$ being a diameter of a light bundle at the respective position being a total optically used diameter at the respective position. Such an arrangement considers that the achieved compensation is particularly effective at positions being at least closed to the pupil plane. In particular, these two element groups, or combined element group, can be symmetrically arranged with regard to the pupil plane, i.e. at positions along the optical system optics having the same relation $D_1/D_2$, but on opposite sides on the pupil plane.

In certain embodiments, the element group or combined element, respectively, is arranged in the first pupil plane along the light propagation of the optical system. This position is advantageous particularly with respect to the enhanced possibilities to vary this pupil plane in the design in the whole optical system with regard to the corrective effect and the geometrical size of the compensation element (or element group) placed therein. This is because the first pupil plane is arranged at a position where the numerical aperture (NA) is relatively low compared to the last (i.e. image-sided) pupil plane and where the numerous optical elements being arranged downstream of this first pupil plane provide sufficient possibilities to correct and optimize the optical imaging.

In some embodiments, the combined element or the element group have a maximum axial length along the optical system axis being not more than 50% (e.g., not more than 20%, and not more than 10%) of the average optically effective diameter of the element group. Such a small axial length may be obtained by arranging the birefringent elements of the group close to each other, by making each optical element with a relatively small thickness and/or by arranging the birefringent elements (or element pairs, respectively) directly adjacent to each other without any other optical elements in between. Such a compact design of the optical element group is advantageous in so far as a divergence of light beams which are passing the same inclined to the optical system axis is reduced or minimized, so that light beams passing the element with the same distance to the optical system axis experience at least approximately the same polarization effect.

In a further aspect, the present disclosure also relates to an optical element including a first lens component embedded in a second lens component, wherein the first lens component is made from spinelle and wherein the second lens component is made from an optically isotropic material. An advantageous effect of such a structure of the optical element is that the first lens component may be made relatively thin, and any deterioration of the optical performance of the optical system due to effects of the element (in particular uniaxial or intrinsic birefringence as well as absorption) may be kept small. Such an optical element can be realized in combination with or also independent of an optical system as outlined above.

The present disclosure also relates to a microlithographic projection exposure apparatus, an illumination system or a projection lens for a microlithographic projection exposure apparatus, the use of an optical system for microlithographic projection exposure, a method of microlithographic structuring a substrate and a microstructured device.

Further aspects and advantageous embodiments of the present disclosure result from the following description as well as the further appended claims whose content is made part of the description in its entirety by reference.

BRIEF DESCRIPTION OF THE DRAWINGS

The disclosure is described in more detail with reference to the following detailed description and based upon preferred embodiments shown in the drawings, in which:

FIG. 13a-c show height profiles (in micrometres, μm) of three optical elements in an element group according to the present disclosure that is used in order to partially compensate for the Jones-Pupil of FIG. 14a-b;

FIG. 14a-b show by way of an example a Jones-Pupil in a microlithography projection lens including a spinelle-100-lens, wherein FIG. 14a shows the distribution of the absolute value of retardation (in nm) and wherein FIG. 14b shows the direction of the fast axis.

DETAILED DESCRIPTION

Figure 1:
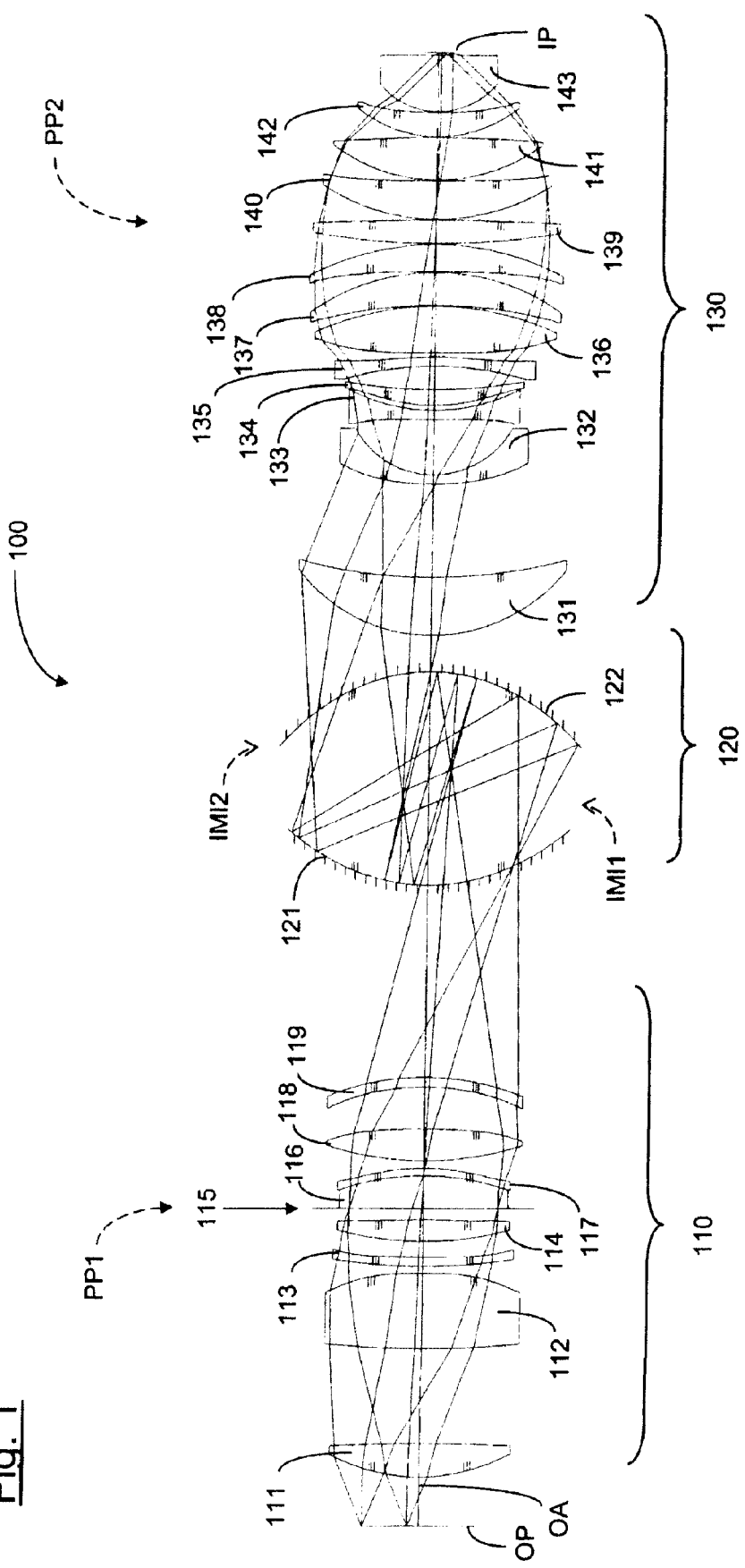
FIG. 1 shows a meridional section of a microlithography projection lens according to an exemplarily embodiment of the present disclosure.

FIG. 1 shows a meridional overall section through a complete catadioptric projection lens 100 in accordance with an embodiment of the disclosure. The design data of the projection lens 100 are set out in Table 1. In this Table, column 1 includes the number of the respective, reflective or otherwise distinguished optical surface, column 2 includes the radius of this surface (in mm), column 3 the distance (also named as thickness, in mm) of this surface from the next following surface, column 4 the material following to the respective surface, column 5 the refractive index of this material at λ=193 nm and column 6 the optically usable, free half diameter of the optical component (in mm).

The surfaces which are identified in FIG. 1 by short horizontal lines and which are specified in Table 2 are aspherically curved, the curvature of those surfaces being given by the following aspheric formula:

$$P(h) = \frac{(1/r) \cdot h^2}{1 + \sqrt{1-(1+K)(1/r)^2 h^2}} + C_1 h^4 + C_2 h^6 + \ldots \quad (5)$$

In that formula (5), P denotes the sagitta of the surface in question in parallel relationship with the optical axis, h denotes the radial spacing from the optical axis, r denotes the radius of curvature of the surface in question, K denotes the conical constant and C1, C2, ... denote the aspheric constants set out in Table 2.

The projection lens 100 includes, along an optical system axis OA and between an object (or reticle) plane OP and an image (or wafer) plane IP, a first subsystem 110 including refractive lenses 111-114 and 116-119, a second subsystem 120 including a first concave mirror 121 and a second concave mirror 122 which are each cut at the appropriate positions to enable the passing of light rays there through, and a third subsystem 130 including refractive lenses 131-143. The image-sided last lens 143 of the third subsystem is a planoconvex lens made from $Lu_3Al_5O_{12}$ (="LuAG") and having a [100]-orientation, i.e. the optical system axis OA of the projection lens 100 is parallel to the [100]crystal axis of the lens 143. The image-sided last lens 143 is adjacent to an immersion liquid being present between the last lens 143 and the light-sensitive layer on the wafer being arranged, during the operation of the projection lens 100, in the image plane IP. The immersion liquid has, in the illustrated embodiment, a refraction index of $n_{imm} \approx 1.65$. A suitable immersion liquid is, e.g., "Decalin". A further suitable immersion liquid is, e.g., Cyclohexane ($n_{imm} \approx 1.57$ at $\lambda \approx 193$ nm).

In the sense of the present application, the term 'subsystem' always denotes such an arrangement of optical elements, by which a real object is imaged in a real image or intermediate image. In other words, each subsystem starting from a given object or intermediate image plane always includes all optical elements to the next real image or intermediate image.

The first subsystem 110 images the object plane OP onto a first intermediate image IMI1, the approximate position of which being marked in FIG. 1 with an arrow. This first intermediate image IMI1 is imaged, by the second subsystem 120, into a second intermediate image IMI2, the approximate position of which is also marked in FIG. 1 with an arrow. The second intermediate image IMI2 is imaged, by the third subsystem 130, into the image plane IP.

At a position marked by arrow 115 in FIG. 1 and close to the pupil plane PP1 within the first subsystem 110, an element group is provided whose structure is explained in the following with reference to FIG. 2a-d and FIG. 3.

The element group 200 consists, according to FIG. 2a, of three birefringent elements 211-213 each being made of optically uniaxial sapphire ($Al_2O_3$). The optical crystal axes of the optically uniaxial material in the three elements 211-213 are, according to FIG. 2c, oriented different from each other. Furthermore, each of the three elements 211-213 includes an aspheric surface only schematically illustrated in FIG. 2a and as explained in more detail with respect to FIG. 3. It is emphasized that the schematic illustration of FIG. 2a only serves to symbolize that each of the elements 211-213 has a varying thickness profile, while a more quantitative description of the shape of the thickness profile can be gathered from the corresponding height profiles of FIG. 3.

Figure 2:
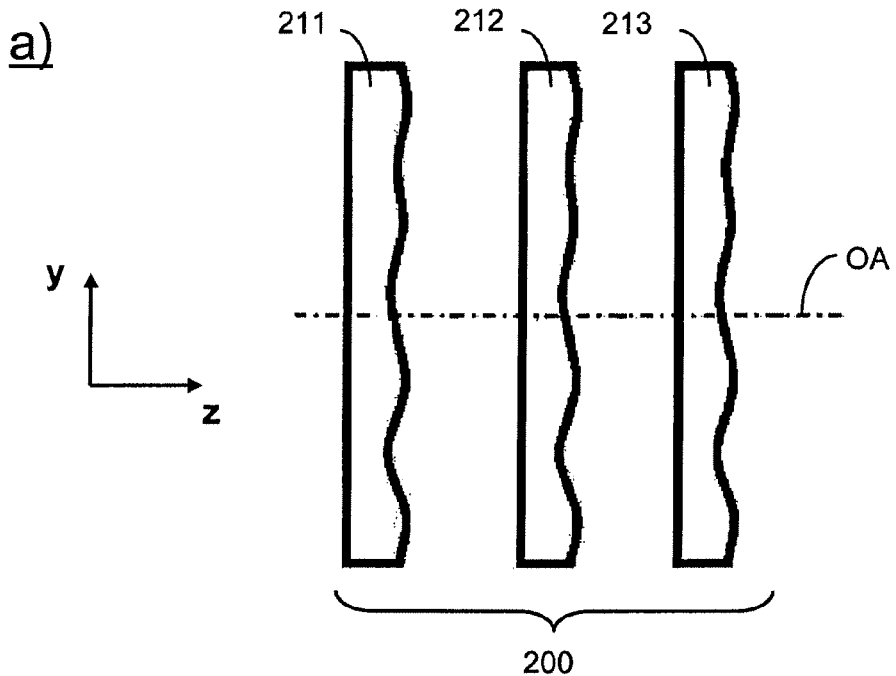
FIG. 2 schematically shows a principal structure of an optical element group in a side view (FIG. 2a and 2b) and in a top view (FIGS. 2c and 2d) on each of the three elements according to embodiments of the present disclosure.
Figure 2:
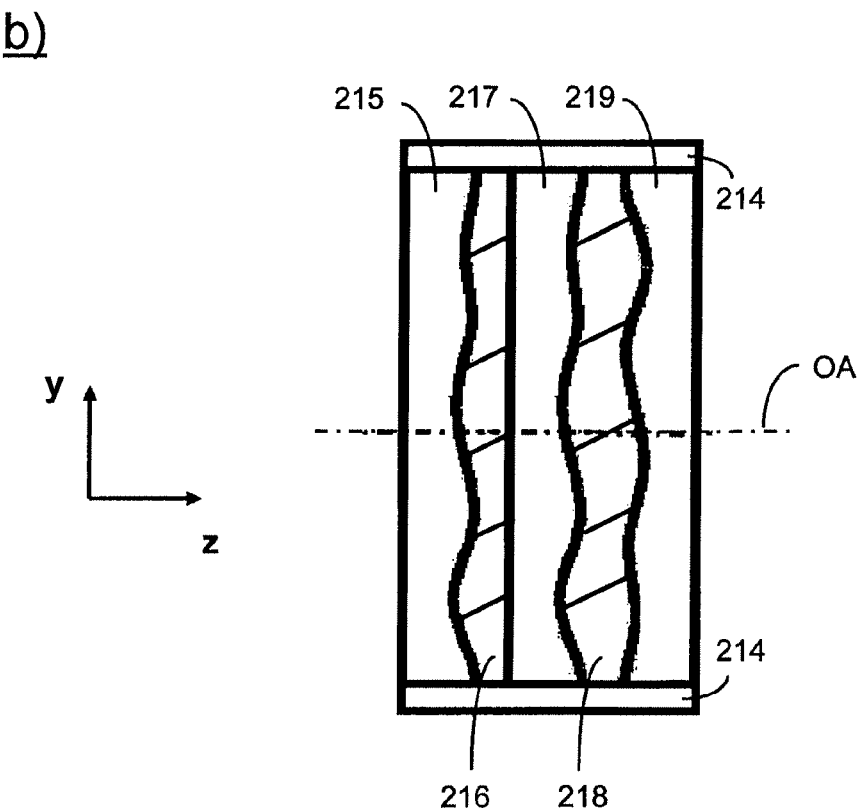
Figure 2C:
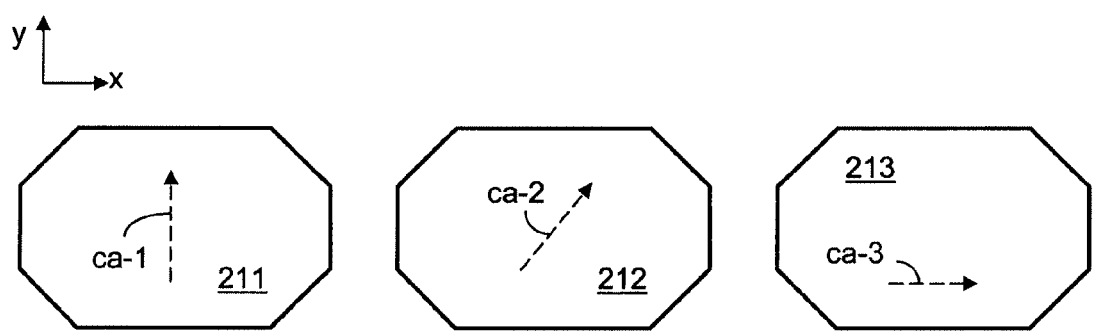

As to the different orientations of the optical crystal axes and more specifically, these optical crystal axes, which are named as ca-1, ca-2 and ca-3 in FIG. 2c, are all oriented in a plane perpendicular to the optical axis OA (=z-axis) of the projection lens 100, i.e. in the x-y-plane according to the coordinate system shown in FIG. 2c. Further, according to FIG. 2c, the optical crystal axis ca-1 of element 211 is oriented parallel to the y-axis, the optical crystal axis ca-2 of element 212 is clockwise rotated around the optical axis OA (i.e. the z-axis) with respect to the crystal axis ca-1 by an angle of 45°, and the optical crystal axis ca-3 of element 213 is also clockwise rotated around the optical axis OA (i.e. the z-axis) with respect to the crystal axis ca-2 by an angle of 45° (i.e. by an angle of 90° with respect to the y-axis).

More generally, the orientation of the optical crystal axis ca-2 in the second optical element 212 can be described as emerging from a rotation of the orientation of the optical crystal axis ca-1 in the first optical element 211 around the optical axis 100 of the projection lens 100, the rotation not corresponding to a rotation around the optical system axis by an angle of 90° or an integer multiple thereof. Furthermore, the orientation of the optical crystal axis ca-3 in the third optical element 213 can be described as emerging from a rotation of the orientation of the optical crystal axis ca-2 in the second optical element 212 around the optical axis OA of the projection lens 100, the rotation also not corresponding to a rotation around the optical system axis OA by an angle of 90° or an integer multiple thereof.

Figure 3A:
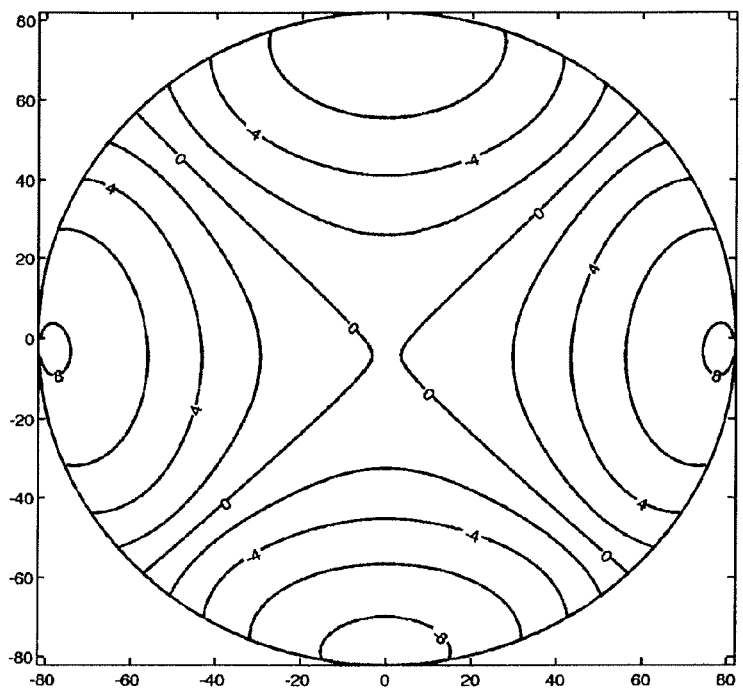
FIG. 3a-c shows height profiles (in micrometres, μm) for specific birefringent elements in an element group according to the embodiments of FIG. 2a-2d.
Figure 3B:
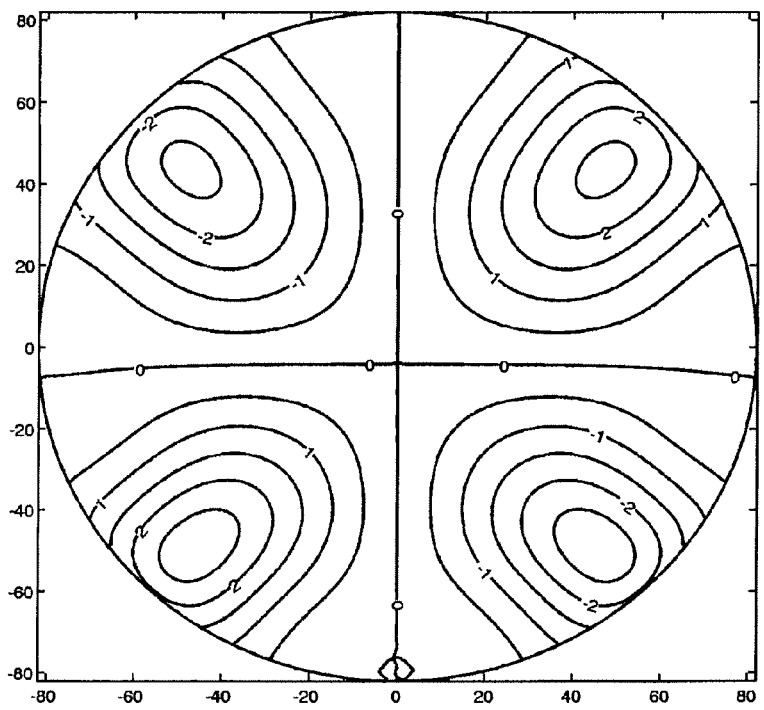
Figure 3C:
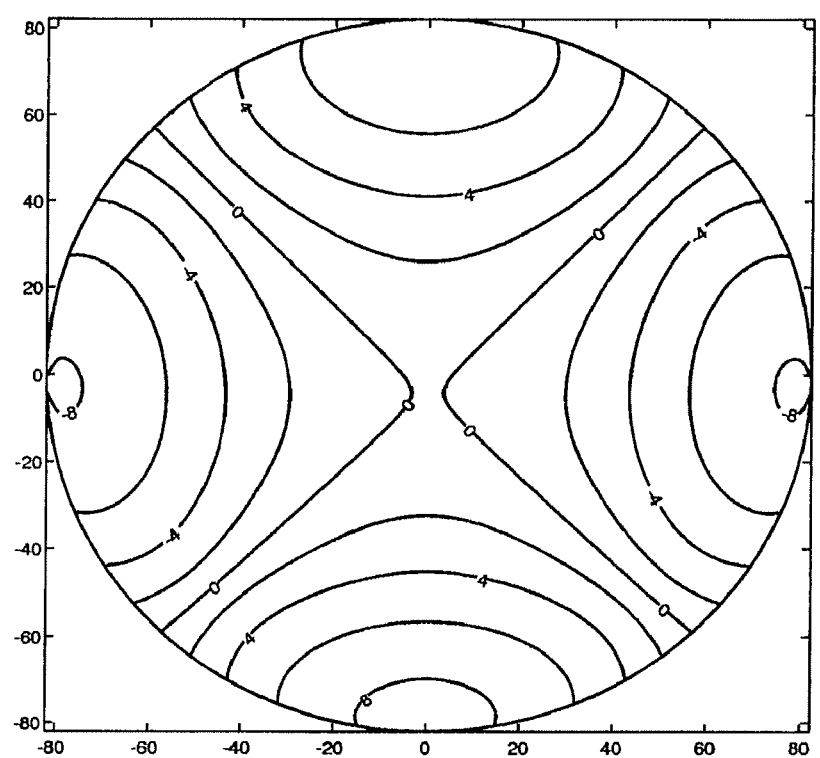

As to the aspheric surface provided on each of the elements 211-213, FIG. 3a shows the height profile (in micrometres, μm) of the first element 211, FIG. 3b for the second element 212 and FIG. 3c for the third element 213. It can be seen that the height profiles of the first element 211 and the third element 213 are of opposite sign and, in the illustrated example, identical in amount.

Figure 4A:
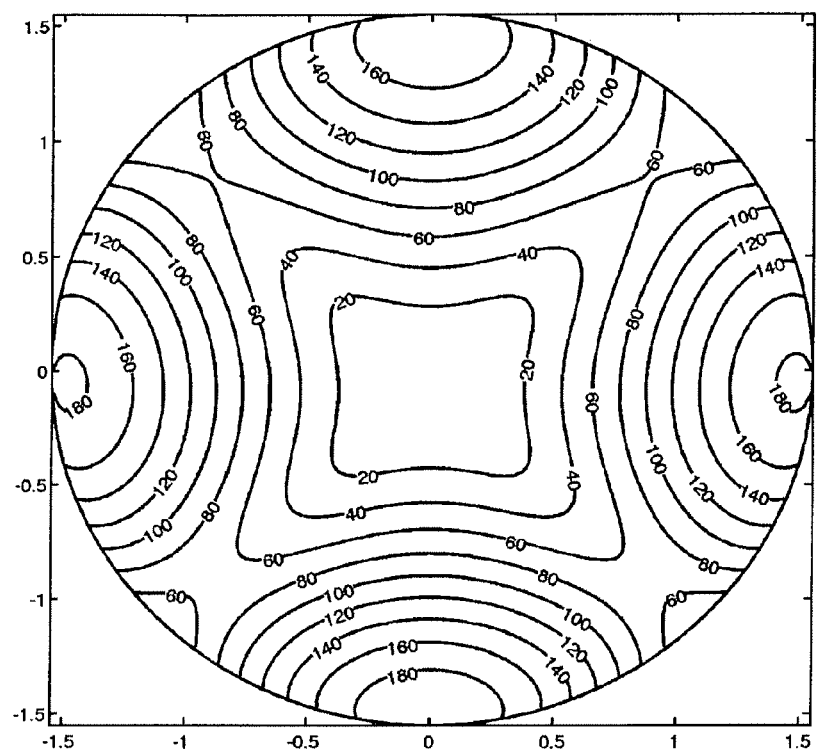
FIG. 4a-b shows the retardation of the projection lens of FIG. 1 without (FIG. 4a) and with an optical element group according to the present disclosure.
Figure 4B:
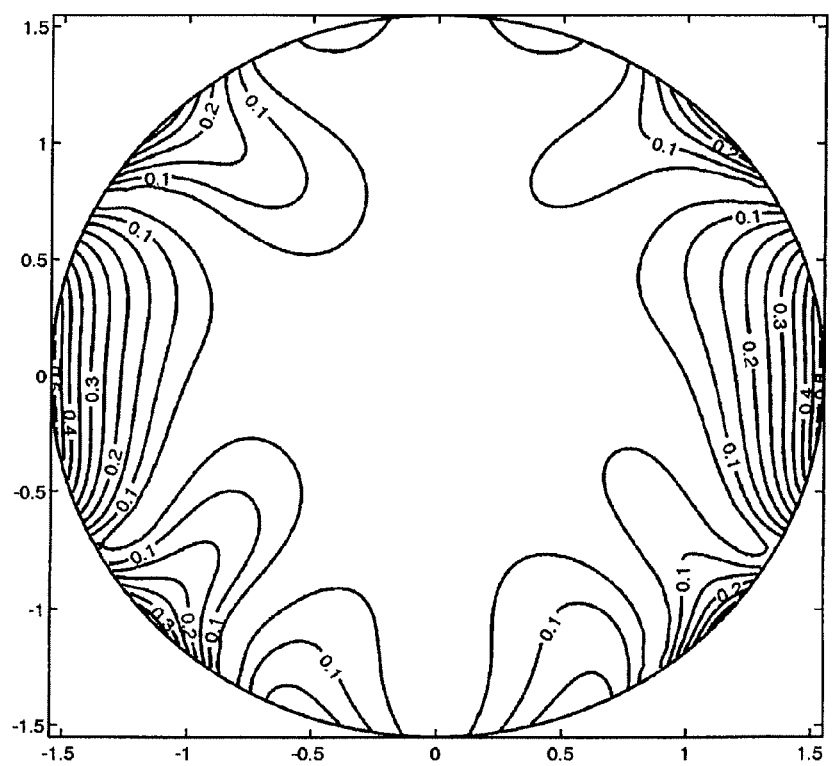

To illustrate the effect of the element group 200 in the projection lens 100, FIG. 4a shows the retardation (in nanometers, m) caused by the image-sided last lens element 143 for the case without the optical element group 200 at the position 115, while FIG. 4b shows the retardation of the projection lens 100 with the optical element group 200 at the position 115. It can be seen that the retardation in FIG. 4a has maximum values of approximately 180 nm, whereas the maximum retardation in FIG. 4b is significantly reduced to very low values of approximately 0.5 nm, which is more than sufficient for typical lithography applications.

Figure 2D:
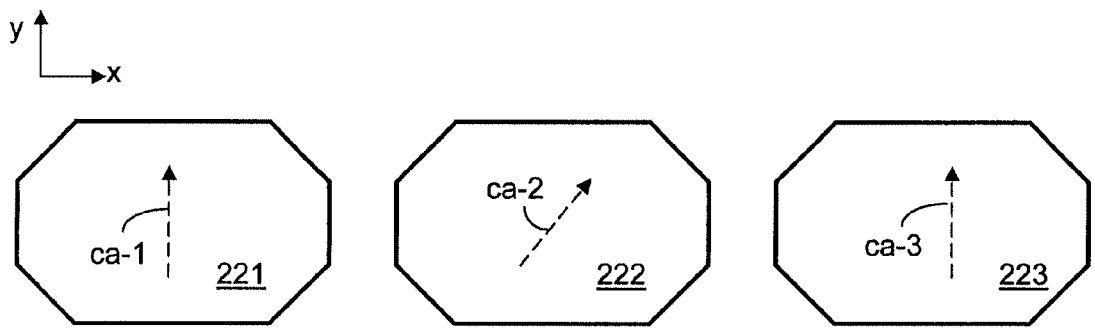

FIG. 2d shows a further example of an element group of elements 221-223, wherein the orientations of the optical crystal axes ca-1 and ca-3 in the first element 221 and the third element 223 are identical and differ from the orientation of the optical crystal axis ca-2 in the second element 222. More specifically and as illustrated in FIG. 2d, the optical crystal axes ca-1 and ca-3 of elements 221 and 223 are both oriented parallel to the y-axis, whereas the optical crystal axis ca-2 of element 212 is rotated around the optical axis OA (i.e. the z-axis) with respect to the crystal axis ca-1 by an angle of 45°.

As a common feature with the embodiment of FIG. 2c, the orientation of the optical crystal axis ca-2 in the second optical element 222 can be described as emerging from a rotation of the orientation ca-1 of the optical crystal axis ca-1 in the first optical element 221 around the optical axis OA of the projection lens 100, the rotation not corresponding to a rotation around the optical system axis by an angle of 90° or an integer multiple thereof. Furthermore, the orientation of the optical crystal axis ca-3 in the third optical element 223 can be described as emerging from a rotation of the orientation of the optical crystal axis ca-2 in the second optical element 222 around the optical axis OA of the projection lens 100, the rotation also not corresponding to a rotation around the optical system axis by an angle of 90° or an integer multiple thereof.

As to the aspheric surface provided on each of the elements 221-223, FIG. 3a shows the height profile (in micrometres, μm) of the first element 221 and the third element 223, whereas FIG. 3b shows the height profile for the second element 222. Accordingly, in this specific example the height profiles of the first element 221 and the third element 223 are identical, which means that this element is suitable to compensate, in the projection lens 100, a retardation without elliptical components. However, the disclosure is not limited thereto, so the disclosure also includes groups of optical elements 221-223 with the principal structure of FIG. 2d, but with different height profiles of the first and third element 221 and 223.

Although the elements 211-213 and 221-223 of the embodiments described with reference to FIG. 2-3 are all made from sapphire ($Al_2O_3$), the disclosure is not limited to this, and other optically uniaxial materials having sufficient transparency in the used wavelength region, for example but not limited to magnesium-fluoride ($MgF_2$), lanthanum-fluoride ($LaF_3$) and crystalline quartz ($SiO_2$) can be alternatively used. Furthermore, the disclosure is not restricted to a realization of all the three elements 211-213 or 221-223 from the same material, so that also different combinations of materials may be used.

FIG. 5a-f show principal structures of further embodiments of an optical element group according to FIG. 2a in a top view on each of the three elements.

Figure 5:
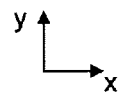
FIG. 5a-f schematically show principal structures of further embodiments of an optical element group according to FIG. 2a in a top view on each of the three elements.
Figure 5:
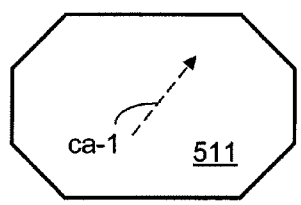
Figure 5:
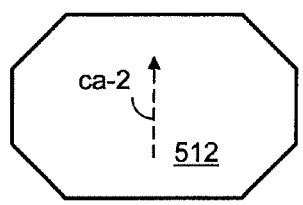
Figure 5:
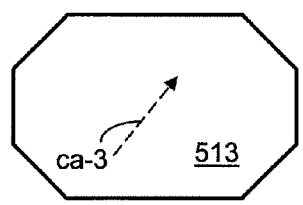
Figure 5:
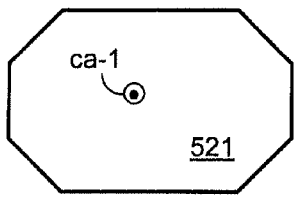
Figure 5:
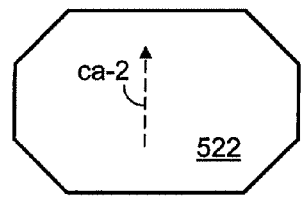
Figure 5:
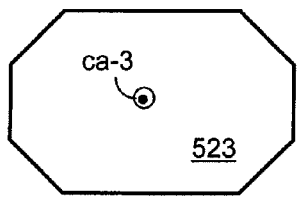
Figure 5:
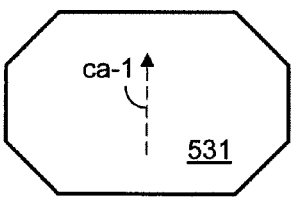
Figure 5:
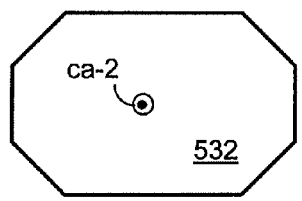
Figure 5:
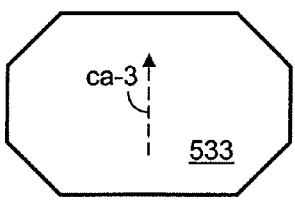
Figure 5:
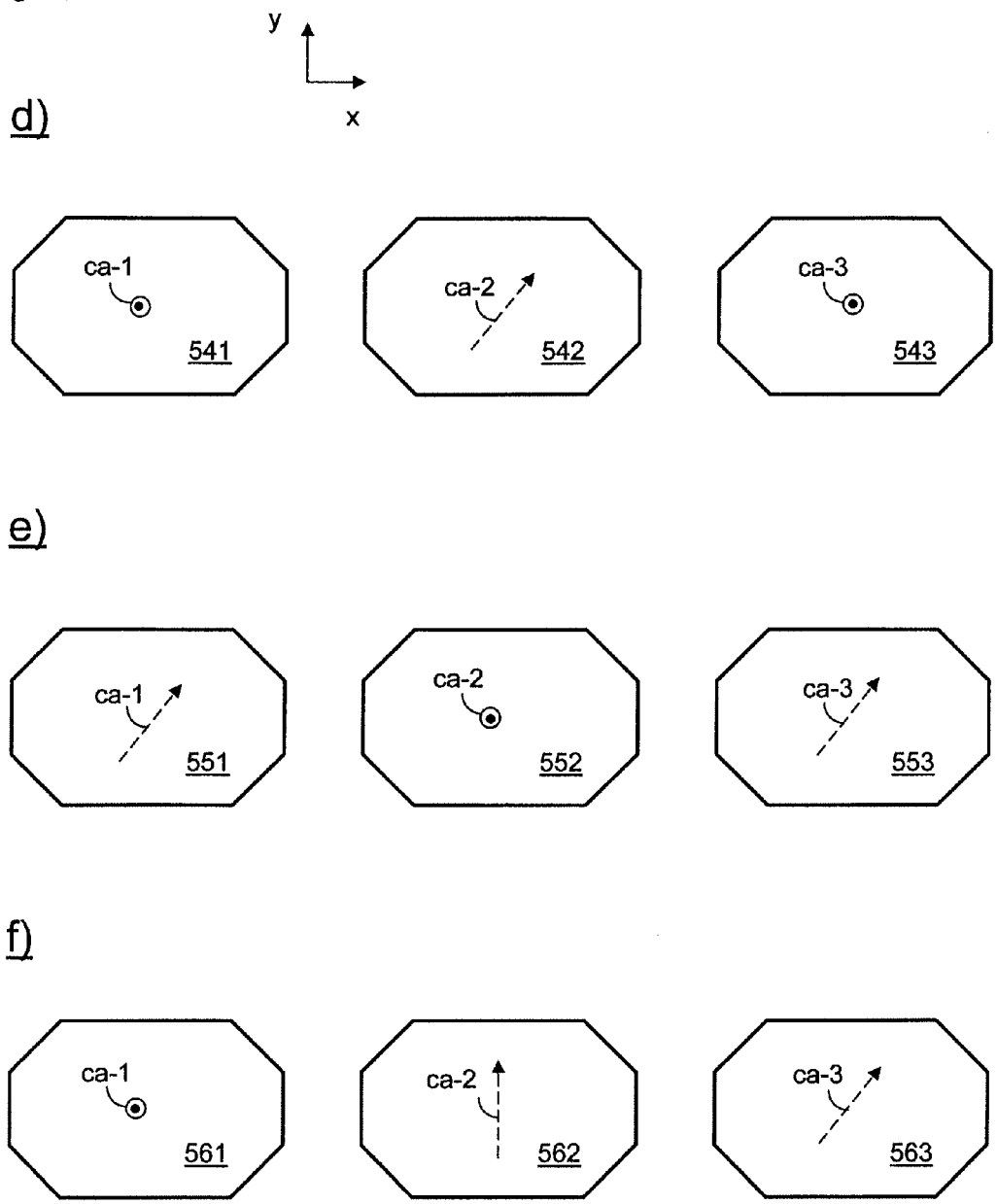

To generalize these different embodiments of element groups according to FIG. 5 and like in FIG. 2c and FIG. 2d, for any of these element groups, the orientation of the optical crystal axis ca-2 in the respective second optical element 512-562 can be described as emerging from a rotation of the orientation ca-1 of the optical crystal axis ca-1 in the respective first optical element 511-561, the rotation not corresponding to a rotation around the optical system axis by an angle of 90° or an integer multiple thereof. Furthermore, the orientation of the optical crystal axis ca-3 in the respective third optical element 513-563 can be described as emerging from a rotation of the orientation of the optical crystal axis ca-2 in the respective second optical element 512-563, the rotation also not corresponding to a rotation around the optical system axis by an angle of 90° or an integer multiple thereof.

As a further common feature of these elements groups and like in FIG. 2c and FIG. 2d, the optical crystal axes "ca-1" and "ca-3" of two of the respective three elements (e.g., element 511 and element 513 in FIG. 5a) are oriented differently from the optical crystal axis of the third element (e.g., element 512 in FIG. 5a).

More specifically according to FIG. 5a, the optical crystal axis "ca-2" of element 512 is running into the y-direction in the coordinate system illustrated in the figure, while the optical crystal axes ca-1 and ca-3 are both rotated around the optical system axis OA and with respect to the optical crystal axis ca-2 by 45°. All elements 511-513 may, e.g., be made from magnesium-fluoride ($MgF_2$), sapphire ($Al_2O_3$) or another suitable optically uniaxial material.

According to FIG. 5b, the optical crystal axis ca-2 of element 522 is running into the y-direction in the coordinate system illustrated in the figure, while the optical crystal axes ca-1 and ca-3 of elements 521 and 523 are running parallel to the optical system axis OA (i.e. into z-direction). Element 522 is, e.g., made from magnesium-fluoride ($MgF_2$), while elements 521 and 523 are made from optically active quartz.

According to FIG. 5c, the optical crystal axis ca-2 of element 532 is running parallel to the optical system axis OA (i.e. into z-direction), while the optical crystal axes ca-1 and ca-3 of elements 531 and 533 are running into the y-direction in the coordinate system illustrated in the figure. Elements 531 and 533 are, e.g., made from magnesium-fluoride ($MgF_2$), while element 532 is made from optically active quartz.

According to FIG. 5d, the optical crystal axis ca-2 of element 542 is running perpendicular to the optical system axis OA and is rotated with respect to the y-direction by 45°, while the optical crystal axes ca-1 and ca-3 of elements 541 and 543 are running parallel to the optical system axis OA (i.e. the z-direction in the coordinate system illustrated in the figure). Element 542 is, e.g., made from magnesium-fluoride ($MgF_2$), while elements 541 and 543 are made from optically active quartz.

According to FIG. 5e, the optical crystal axis ca-2 of element 552 is running parallel to the optical system axis OA (i.e. the z-direction in the coordinate system illustrated in the figure), while the optical crystal axes ca-1 and ca-3 of elements 551 and 553 are running perpendicular to the optical system axis OA and are rotated with respect to the y-direction by 45°. Elements 541 and 543 are made from magnesium-fluoride ($MgF_2$), while element 542 is made from optically active quartz.

According to FIG. 5f, the optical crystal axis ca-1 of element 561 is running parallel to the optical system axis "OA" (i.e. into z-direction). The optical crystal axis ca-2 of element 562 is running into the y-direction. The optical crystal axis ca-3 of element 563 is running perpendicular to the optical system axis OA and is rotated with respect to the y-direction by 45°. Elements 562 and 563 are, e.g., made from magnesium-fluoride ($MgF_2$), while element 561 is made from optically active quartz. Accordingly, in the embodiment shown in FIG. 5f, the optical crystal axes of all of the three optical elements 561-563 are, like in the embodiment of FIG. 2c, oriented different from each other. Of course, the embodiment shown in FIG. 5f is not limited to the illustrated order of elements 561-563 but includes all possible permutations of these elements (with, e.g., element 563 being arranged between elements 561 and 562 etc.).

As a further common feature of the above described element groups, each of them includes three optical elements being made of an optically uniaxial material and having a varying thickness profile along the optical system axis, wherein an optical crystal axis in each of the optical elements is either substantially perpendicular or substantially parallel to the optical system axis, and wherein the optical crystal axes of at least two of the three optical elements are oriented different from each other.

In the embodiments of FIGS. 2d and 5a, all of the three optical elements have an optical crystal axis which is substantially perpendicular to the optical system axis, wherein the optical crystal axes of a first optical element and a second optical element (namely elements 211 and 213 or 511 and 513, respectively) of the group are substantially parallel to each other and rotated around the optical system axis with respect to the optical axis of a third optical element (namely elements 212 or 512, respectively) of the group.

In the embodiments of FIG. 5b-f, only one or two of the optical elements (namely elements 522, 531, 533, 542, 551, 553) of the group have an optical crystal axis which is substantially perpendicular to the optical system axis, wherein the other optical element(s) (namely elements 521, 523, 532, 541, 543, 552, 561) of the group have an optical crystal axis which is substantially parallel to the optical system axis. In these embodiments, the elements having an optical crystal axis which is substantially parallel to the optical system axis OA are made from an optically active material, e.g., quartz.

In the embodiment according to FIG. 5f, the optical crystal axes of all of the three optical elements 561-563 are oriented different from each other. The element having an optical crystal axis which is substantially parallel to the optical system axis OA is made from an optically active material, e.g., crystalline quartz.

FIG. 2b shows an embodiment for an element group according to the present disclosure, which has the advantageous effect that a detrimental influence of the element group on the so-called scalar phase can be kept low. According to the concept schematically illustrated in FIG. 2b, intermediate spaces 216, 218 between different birefringent elements 215, 217 and 219 are filled with a liquid in order to reduce the shift in refractive index occurring when the light passing the optical group enters a light entrance surface or leaves a light exit surface of any of the birefringent elements. In the specific embodiment according to FIG. 2b, each of the birefringent elements 215, 217 and 219 is made of $MgF_2$, and the intermediate spaces 216 and 218 are filled with water ($H_2O$).

At a typical operating wavelength of $\lambda \approx 193.38$ nm, the ordinary refractive index of $MgF_2$ is $n_o \approx 1.4274$, and the extraordinary refractive index is $n_e \approx 1.4410$, corresponding to an average refractive index $\bar{n}=(n_o+n_e)/2 \approx 1.4342$. The refractive index of water ($H_2O$) at $\lambda \approx 193.38$ nm is 1.4366. Accordingly, the shift in refractive index occurring between the birefringent elements 215, 217 and 219 and the intermediate spaces 216 and 218 amounts (for the averaged index in $MgF_2$) to $\Delta n \approx 0.0024$. For comparison, the shift in refractive index, if the intermediate spaces 216 and 218 are filled with a typical filling gas as, e.g., nitrogen ($N_2$) at $\lambda \approx 193.38$ nm, is $\Delta n \approx 0.439$. Accordingly, the shift in refractive index occurring between the birefringent elements 215, 217 and 219 and the intermediate spaces 216 and 218 is reduced, for the embodiment of FIG. 2b, approximately by a factor of 180.

Of course, the above concept of filling the intermediate spaces between the birefringent element with a suitable liquid in order to reduce the shift in refractive index occurring at light entrance surfaces and/or light exit surfaces of the birefringent elements is not limited to the above combination of $MgF_2$ with $H_2O$. In general, a liquid may be regarded as suitable to significantly improve the above index-shift-situation between the birefringent elements of the inventive element group, and thus reduce a detrimental influence of the element group on the so-called scalar phase, if a gap between at least two of the birefringent elements is at least partially filled with a liquid having a refraction index that differs not more that 30% (e.g., not more than 20%, not more than 10%) of the refraction indices of the two birefringent elements. Depending on the refractive indices of the material in the adjacent birefringent elements, such suitable liquids may also be so-called high-index immersion liquids which are also used as immersion liquids in the region between the image-sided last lens and the light-sensitive layer being present on the wafer, such as, e.g., "Decalin" ($n_{imm} \approx 1.65$ at $\lambda \approx 193$ nm) or Cyclohexane ($n_{imm} \approx 1.57$ at $\lambda \approx 193$ nm).

Figure 6:
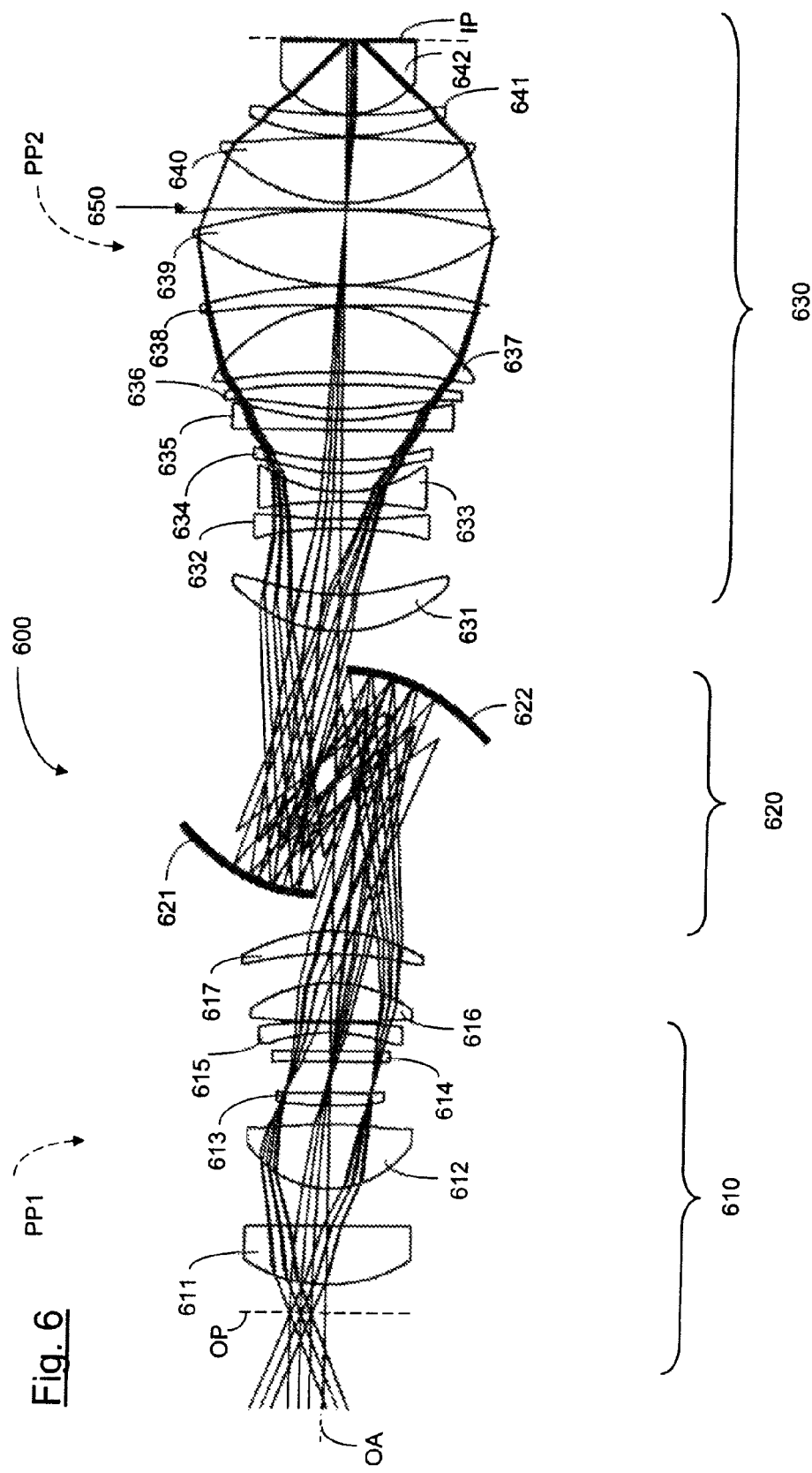
FIG. 6 shows a meridional section of a microlithography projection lens according to a further exemplarily embodiment of the present disclosure.

FIG. 6 shows a meridional overall section through a complete catadioptric projection lens 600 in accordance with a further embodiment of the disclosure. The design data of the projection lens 600 are set out in Table 3, with the surfaces specified in Table 4 are aspherically curved.

The projection lens 600 has a similar, catadioptric design as the projection lens 100 of FIG. 1, and includes along the optical axis OA a first subsystem 610 with lenses 611-617, a second subsystem 620 with two mirrors 621 and 622 and a third subsystem 630 with lenses 631-642.

The projection lens 600 also includes, at a position marked with an arrow and closed to the pupil plane PP2 within the third subsystem 630, an element group 650, embodiments of which being described in the following with reference to FIGS. 7 and 8. The advantageous effect achieved by these embodiments is that a detrimental influence of the element group on the so-called scalar phase can be kept low and, in the ideal case, made equal to the effect caused by a plan-parallel plate on the scalar phase.

To this, the element group 650 as schematically illustrated in FIG. 6 includes three birefringent elements 651, 652 and 653, each of which being composed of two plates 651a and 651b, 652a and 652b, or 653a and 653b, respectively. Each of the respective plates being attributed to each other has an aspheric surface and a plane surface, wherein the aspheric surfaces of the plates being attributed to each other are complementary and add up to a plan-parallel geometry of the such-formed birefringent element 651, 652 or 653, respectively. With other words, the thickness of each formed birefringent element 651, 652 or 653, respectively, is constant over its cross-section. Furthermore, as can be seen in FIG. 8a which is showing all six plates 651a-653b in an exploded way of illustration just for a better representation of the optical crystal axes, the optical crystal axes of the respective plates 651a and 651b, 652a and 652b, or 653a and 653b, respectively being attributed to each other are oriented perpendicular to each other. The plates of each pair 651a and 651b, 652a and 652b, or 653a and 653b, respectively, and all six plates 651a-653b can be made of the same optically uniaxial material, e.g., $Al_2O_3$, $MgF_2$ or $LaF_3$.

As a consequence of the plan-parallel geometry of the birefringent elements 651-653, each of the birefringent elements 651, 652 and 653 does not disturb or affect the scalar phase of light passing though the element group 650, since the aspheric boundaries which are present within each birefringent element 651, 652 and 653 at the position where the two plates complementary abut on each other with their aspheric surface are only boundaries between regions of identical refractive indices. The embodiment shown in FIG. 8a is just exemplarily, and further embodiments to realize the general concept of FIG. 7 can be constructed by composing an element group as follows: As to the respective first plates 651a, 652a and 653a of each birefringent element 651, 652 and 653, these plates are arranged according the optical axis OA according to the principal structure of FIG. 5a. Similarly, the other embodiments described above and illustrated in FIG. 2c-d and FIG. 5b-f may be modified by replacing, in each of the embodiments, at least one (and desirably all) of those birefringent elements which have their optical crystal axis oriented in a plane perpendicular to the optical system axis OA by a pair of plates as described before with reference to FIG. 7-8, i.e. by plates being pairwise complementary to each and adding up to a plan-parallel geometry of the such-formed birefringent element and having optical crystal axes being oriented pairwise perpendicular to each other.

Although the three birefringent elements 651-653 of FIG. 7a of the optical group 650 are shown separated from each other, they may be, as shown in FIG. 7b, joined together to form a common optical element 650', which is favourable in view of the mechanical stability of the arrangement taking into consideration the relatively low thickness of the plates 651a-653b, which is typically much less than 1 mm and may, e.g., be in the range of several micrometers.

In further embodiments, one or more support plates of a significantly larger thickness are used as schematically illustrated in FIGS. 7c and 7d. More specifically, FIG. 7c shows two such support plates 660 and 670, one of each being arranged between each neighboured birefringent elements 651 and 652 or 652 and 653, respectively, to form a common element 650". FIG. 7d shows all three birefringent elements 651-653 joined together as already shown in FIG. 7b and supported by a single support plate 680 to form a common element 650'". A perspective view of this embodiment is shown in FIG. 8b. Such one or more support plates 660, 670 and 680 can be made from an optically isotropic material such as fused silica ($SiO_2$). Although the thicknesses of such support plates are principally arbitrary, typical thicknesses are in the range of several millimetres.

Figure 8:
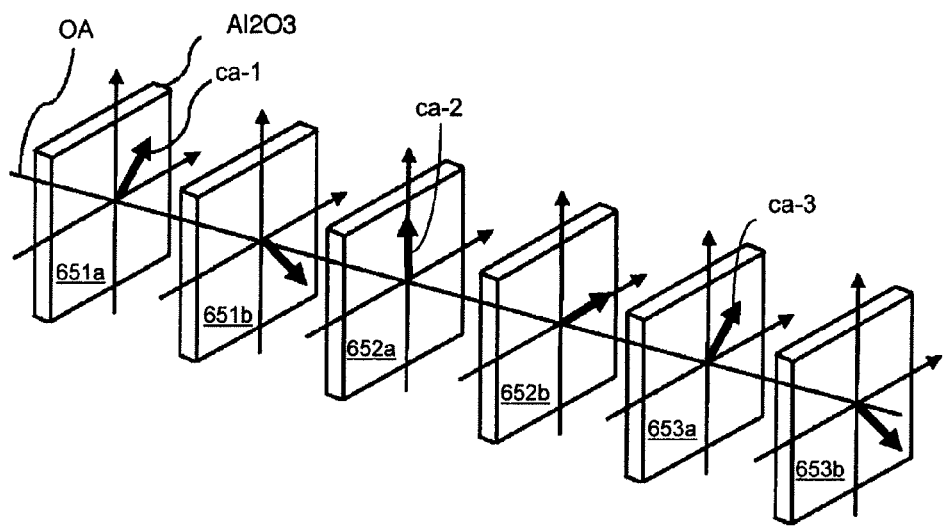
Figure 8:
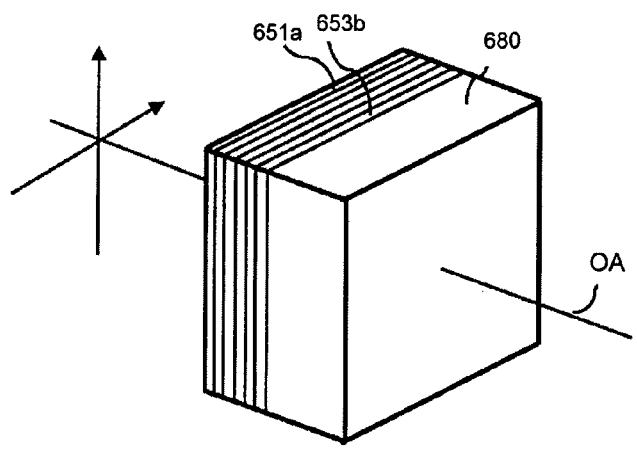

The height profiles of the birefringent elements according to FIG. 8 are shown in FIG. 9. A quantitative description of the height profiles of the birefringent elements can be given, e.g., based on the commercially available software "CODE V 9.6" (October 2005) of "OPTICAL RESEARCH ASSOCIATES", Pasadena, Calif. (USA), according to which the respective free-form surfaces, as described in the corresponding Release Notes of this software, are described via a polynomial approximation using the equation $$z = \frac{c \cdot r^2}{1 + \sqrt{[1-(1+k)\cdot c^2 \cdot r^2]}} + \sum_j C_{j+1} \cdot Z_j, \quad (6)$$

wherein z denotes the sagitta of the surface parallel to the z-axis, c denotes the vertex curvature, k denotes the conical constant, $Z_j$ denotes the $j^{th}$ Zernike polynomial (standard Zernike polynomials in radial coordinates, i.e. $Z_1=1$, $Z_2=R\cdot\cos\theta$, $Z_3=R\cdot\sin\theta$, $Z_4=R^2\cos 2\theta$, etc.) and $C_{j+1}$ denotes the coefficient for $Z_j$.

Figure 9A:
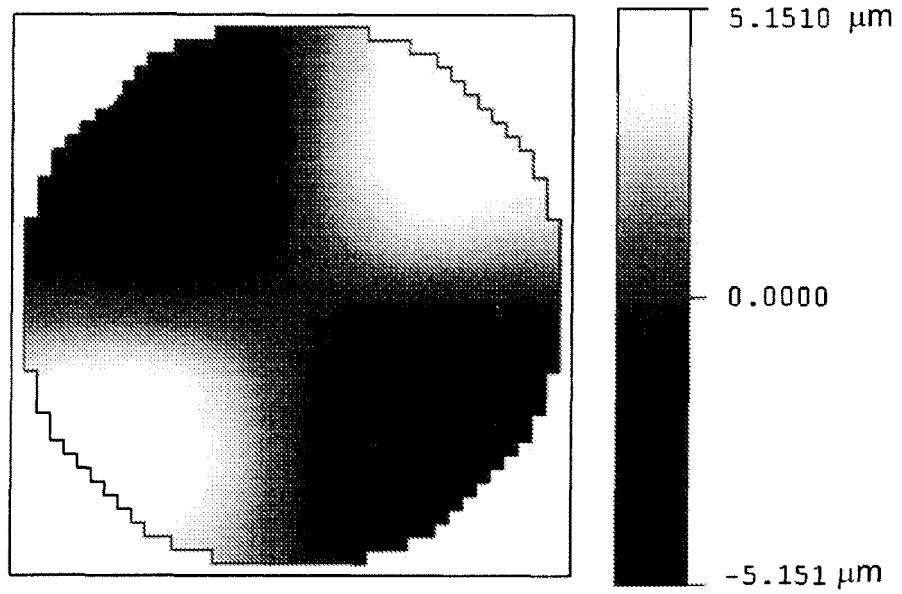
FIGS. 9a-c show height profiles for birefringence elements in the optical group according to FIGS. 7 and 8 according to an embodiment of the disclosure.
Figure 9B:
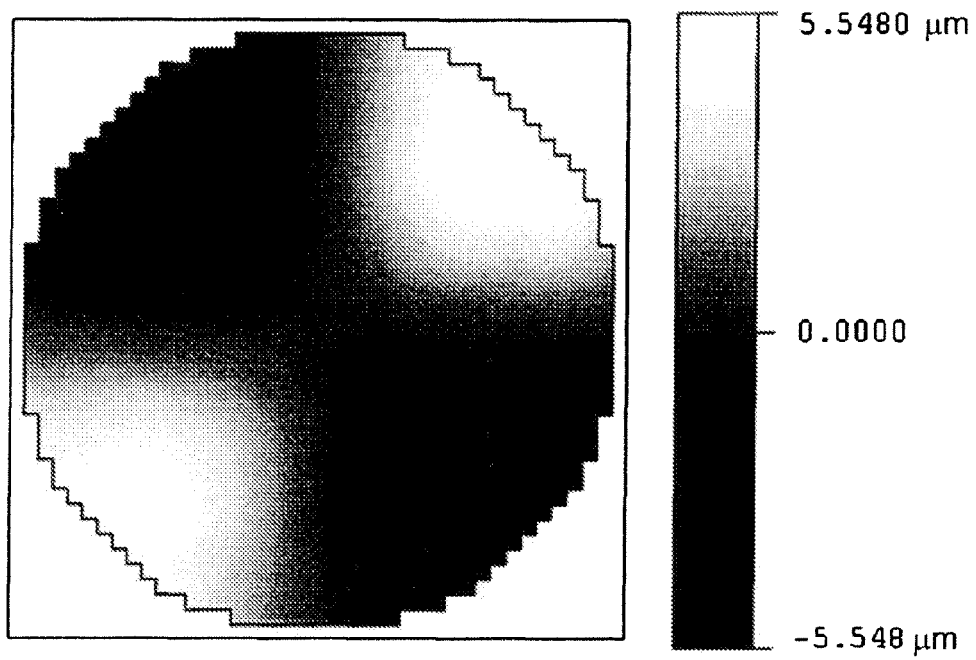
Figure 9C:
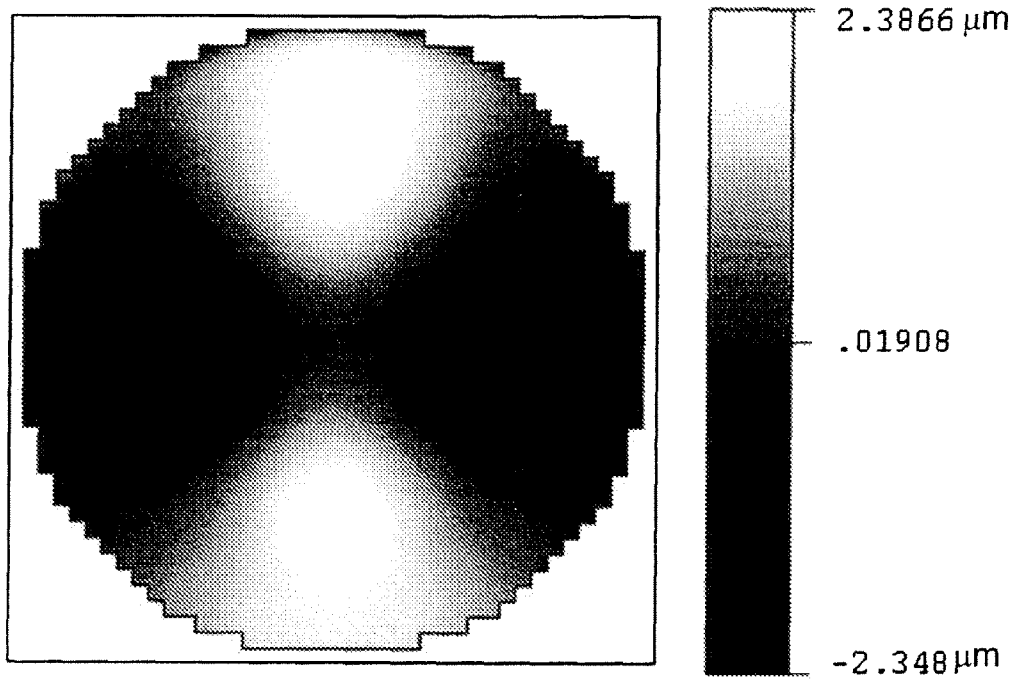

For the embodiment of FIG. 9a-9c, Table 5 gives for each of the free-form surfaces 41, 43 and 45 the corresponding coefficients of the above Zernike polynomials, wherein $ZP_1=C_2$ denotes the coefficient of term 1-zernike-polynomial, $ZP_2=C_3$ denotes the coefficient of term 2-zernike-polynomial, . . . , $ZP_{63}=C_{64}$ denotes the coefficient of term 63-zernike-polynomial etc.

Figure 7:
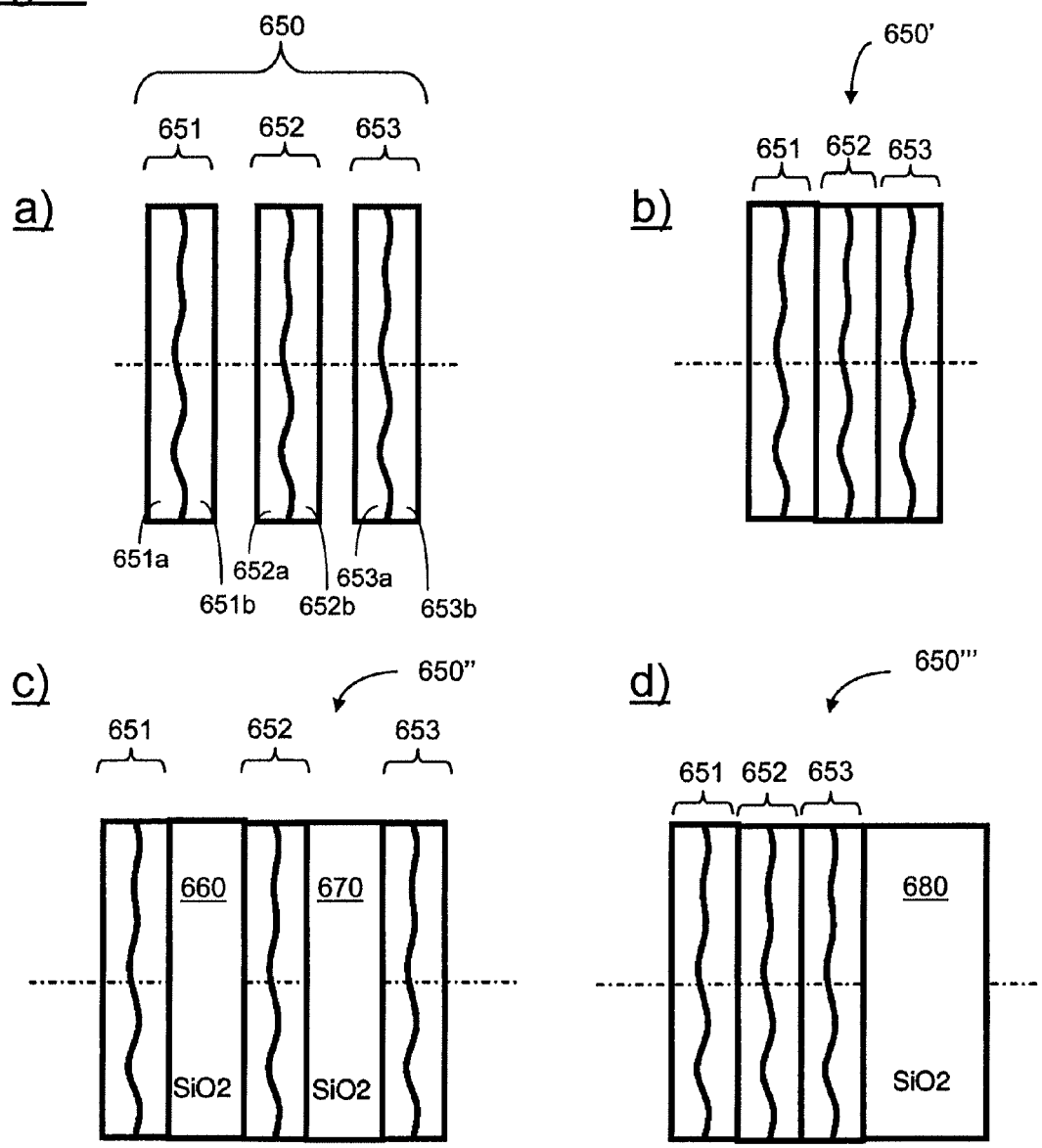
FIGS. 7a-d and 8a-b show principal structures of an optical element group according to further embodiments of the present disclosure.

The effect of the corresponding optical group is shown in FIG. 10a-10b by way of the respective retardance pupil map for the projection lens with (FIG. 10a) and without (FIG. 10b) an element group according to FIG. 7-9. It can be seen that the element group effects a significant reduction of the retardance (note the different scales in FIG. 10a and 10b).

Figure 11:
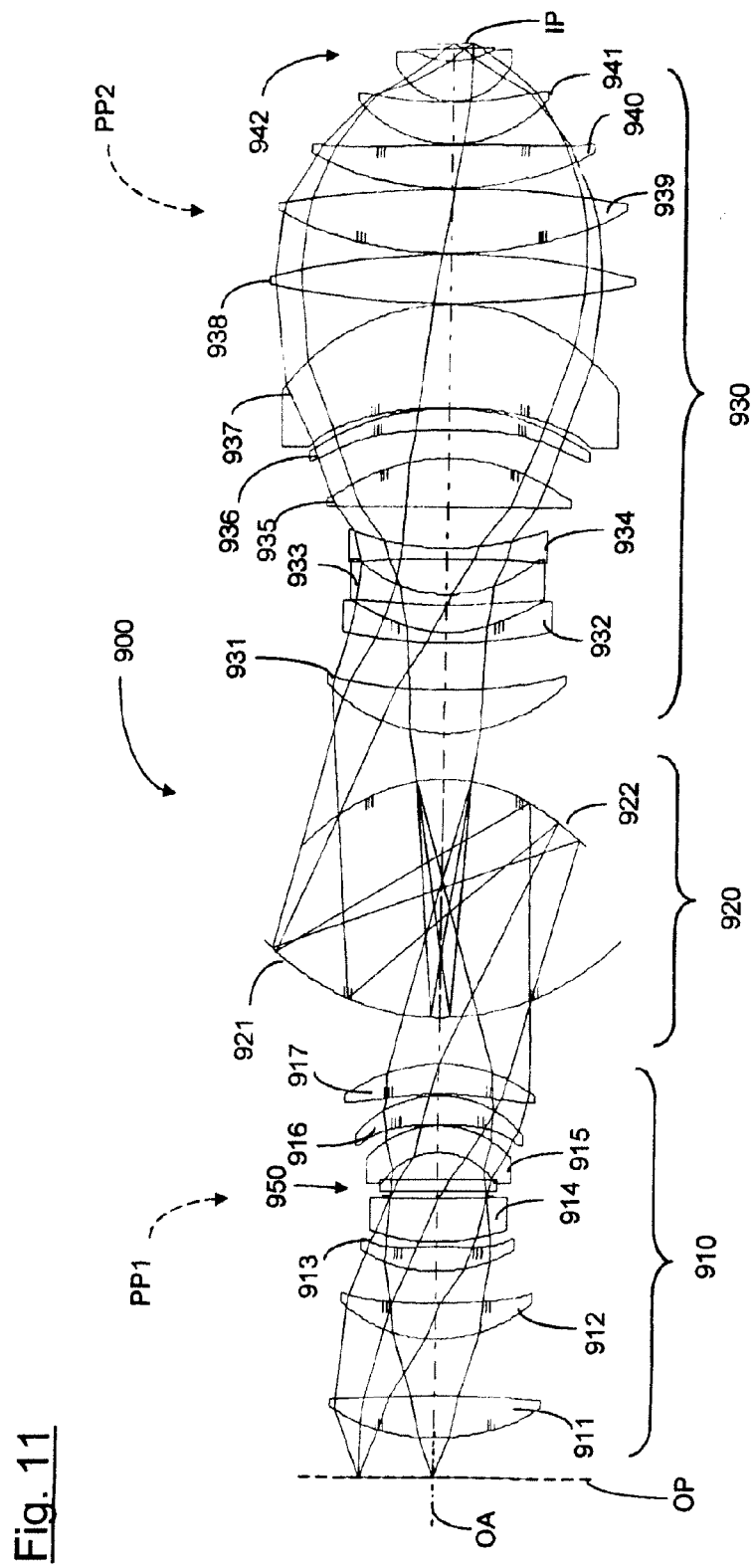
FIG. 11 shows a meridional section of a microlithography projection lens according to a further exemplarily embodiment of the present disclosure.

FIG. 11 shows a meridional overall section through a complete catadioptric projection lens 900 in accordance with a further embodiment of the disclosure. The projection lens 900 has a similar design as the projection lens 100 of FIG. 1, and includes along the optical axis OA a first subsystem 910 with lenses 911-917, a second subsystem 920 with two mirrors 921 and 922 and a third subsystem 930 with lenses 931-942.

In order to compensate for a disturbance of the polarization within the projection lens 900, the projection lens 900 again includes, in the first pupil plane "PP1" and at a position marked with arrow, a correction element 950 formed of an element group of three birefringent elements as has been described above, with the height profiles of three optical elements being discussed below with reference to FIG. 13a-13c.

As a further aspect of the projection lens 900 of FIG. 11, the last lens 942 of the third partial system 930 (i.e. the lens closest to the image plane IP) includes a first lens component 942a embedded in a second lens component 942b as described below in more detail with reference to the enlarged schematic diagram of FIG. 12.

It is to be noted that the realization of this "embedded lens"-configuration is of course not limited to a combination with the compensation concept of making use, for compensation of a disturbance of polarization, of an optical group or correction element composed of at least three birefringent elements with aspheric surfaces. Accordingly, the aspect illustrated in FIG. 12 also covers other designs (without such correction element or optical group) where an optical lens, which may particularly be an image-sided last element, i.e. an optical element being most close to the image plane, is realized by embedding a first lens component in a second lens component, as described in the following.

Figure 10:
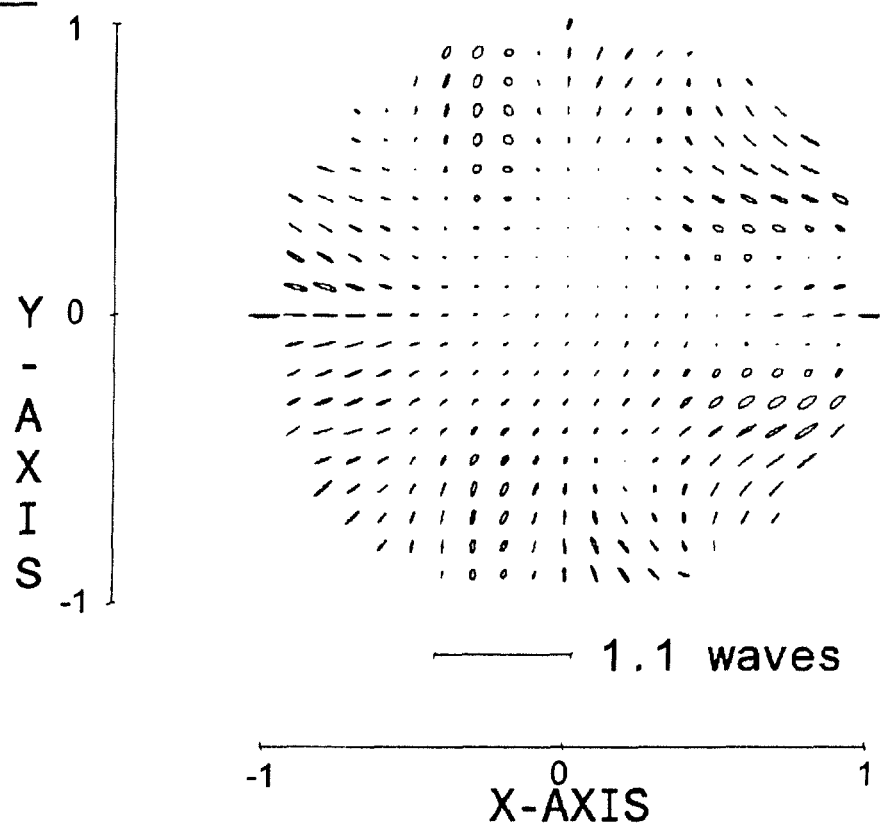
FIG. 10a-b show the respective retardance pupil map for the projection lens with (FIG. 10a) and without (FIG. 10b) an element group according to FIG. 7-9.
Figure 10:
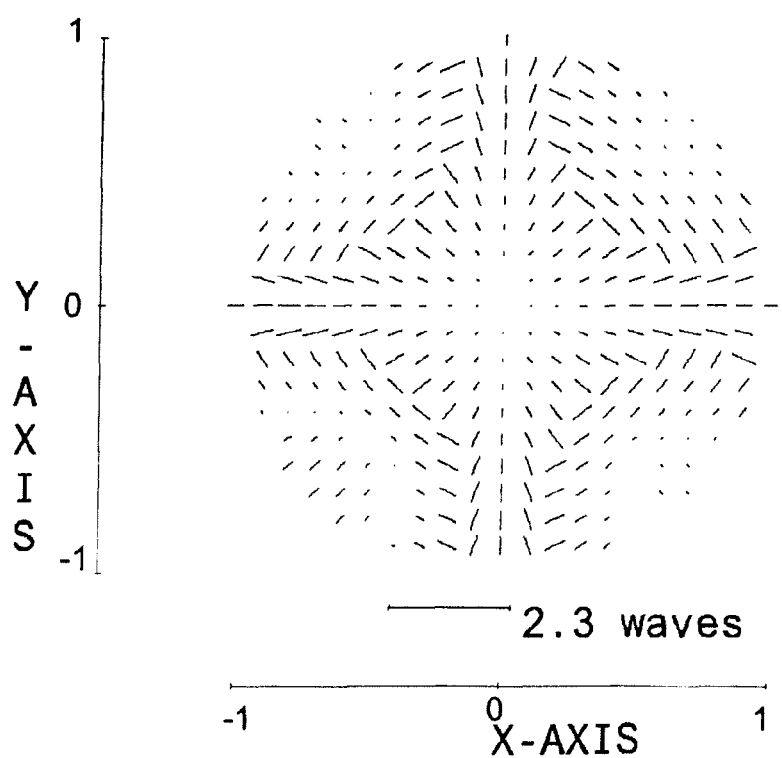

Generally, the arrangement shown in FIGS. 11 and 10 is advantageous if the first lens component 942a is made from an optically uniaxial material or a material of cubic crystal structure with strong intrinsic birefringence, and the second lens component 942b is made from an optically isotropic material. Beside a cubic crystal like spinelle, the material of the first lens component can, e.g., be selected from the group that consists of magnesium-fluoride ($MgF_2$), lanthanum-fluoride ($LaF_3$), sapphire ($Al_2O_3$) and crystalline quartz ($SiO_2$). An advantageous effect of the above structure of the optical element is that the first lens component 942a may be made relatively thin, and any deterioration of the optical performance of the optical system due to effects of the element (in particular uniaxial or intrinsic birefringence as well as absorption) may be kept small.

Figure 12:
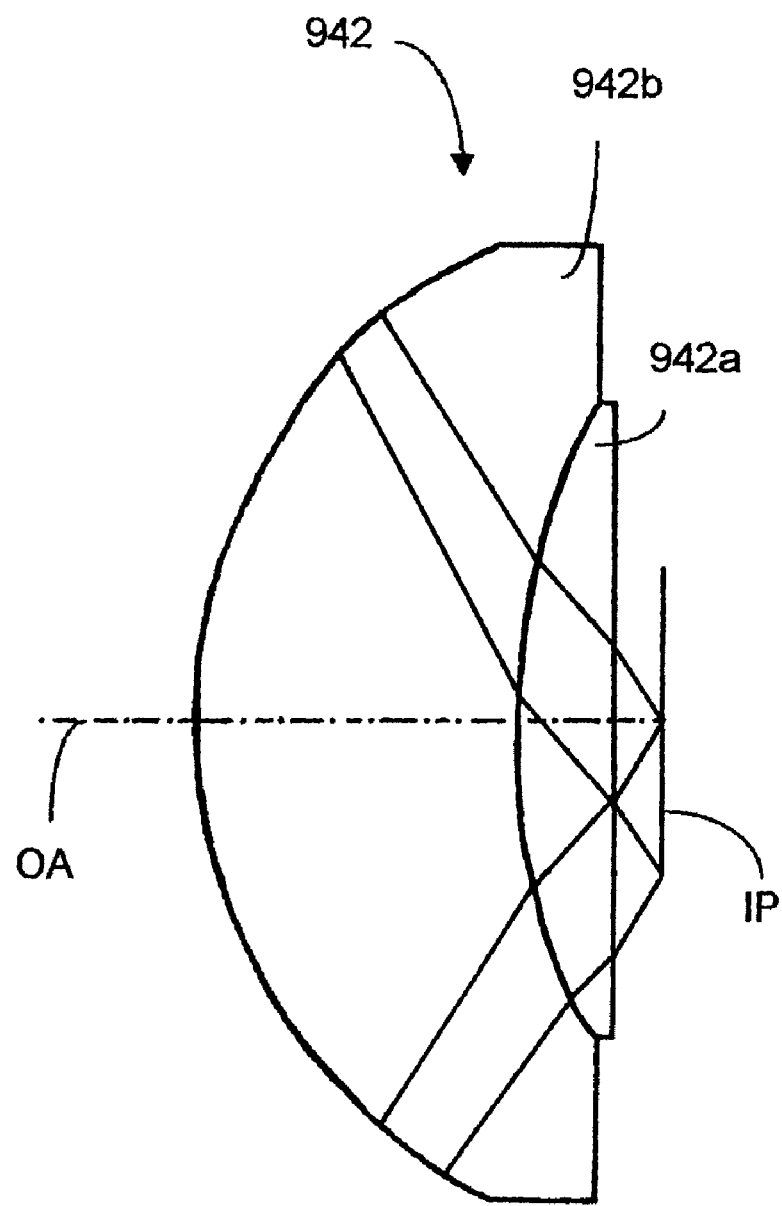
FIG. 12 shows a detail of the microlithography projection lens of FIG. 11.

In the exemplarily embodiment of the image-sided last lens 942 of FIGS. 11 and 12, the first lens component 942a is made from (100)-spinelle, and the second lens component 942b is made from fused silica ($SiO_2$). In the specific example of FIGS. 11 and 12, the lens 942 is described by the following parameters of Table 6:

TABLE 6

| Image field size | $L_{max}$ | 26 mm |
|---|---|---|
| Numerical Aperture | NA | 1, 5 |
| Refraction index (Immersion) | $n_{Immersion}$ | 1, 7 |
| Working distance | S | 3 mm |
| Lens thickness | H | 12 mm |
| Max. propagation angle | $\vartheta_{max} = \arcsin\dfrac{NA}{n_{Immersion}}$ | 62° |
| Lens diameter | $D = L_{max} + 2s \tan \vartheta_{max}$ | 40 mm |

Furthermore, the arrangement of FIG. 12 can be realized by a close contact between the light entrance surface of the first lens component 942a and the light exit surface of the second lens component 942b. Alternatively, an immersion liquid layer or a small air-gap may be arranged between the light entrance surface of the first lens component 942a and the light exit surface of the second lens component 942b.

Referring again to the correction element 950 mentioned above, the correction element is used in the projection lens 900 for compensating the Jones-Pupil illustrated in FIG. 14a-b, wherein the Jones-Pupil has been determined for a microlithography projection lens including a spinelle-100-lens. More specifically, FIG. 14a shows the distribution of the absolute value of retardation (in nm) and FIG. 14b shows the direction of the fast axis of retardation.

FIG. 13a-c show the height profiles of the first, second and third optical element, respectively, being arranged according to the general structure of FIG. 2a. In the illustrated embodiment, each of the optical elements 951-953 is made of magnesium-fluoride. These height profiles are determined by first determining, for each of the first, second and third optical element, the retardation distribution desired to achieve the desired compensation effect, and then calculating the corresponding height profile. Generally, in order to provide at a predetermined position a predetermined retardation of $\Delta\varphi$, a thickness d is used as given in the (already above-mentioned) equation (4).

$$d = \frac{\lambda \Delta \varphi}{2\pi \Delta n} \quad (4)$$

Figure 14:
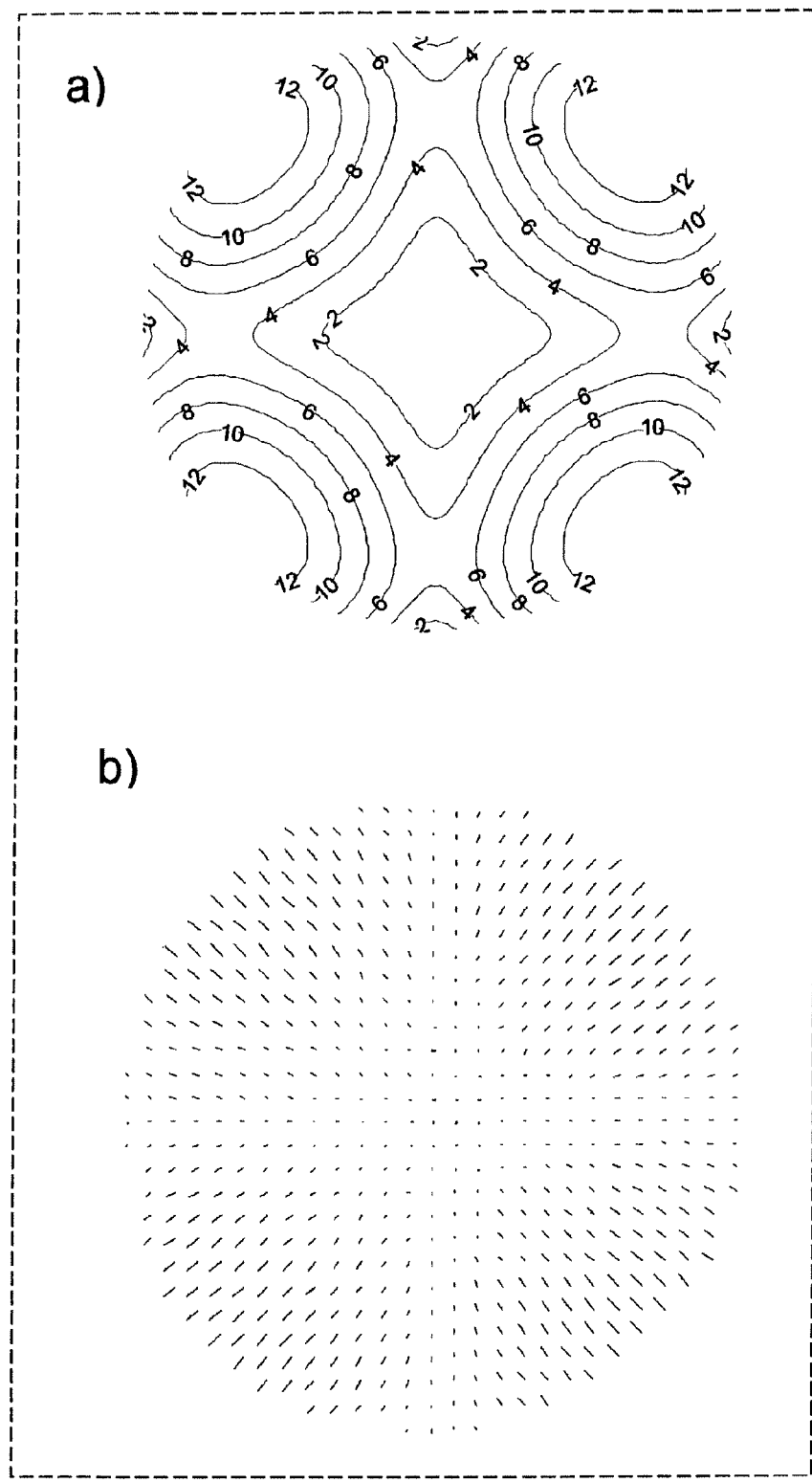

As to the general shape of the Jones-Pupil illustrated in FIG. 14, the distribution of retardation shown in FIG. 14a has a fourfold symmetry as it is characteristic for the spinelle-[100]-lens to be compensated for in the exemplarily embodiment. Furthermore, it can be seen that for each of the first, second and third optical element, the height profile has a mirror symmetry with two axes as well as a sign-change with rotation by an angle of 90°.

According to a further aspect of the disclosure, a group of optical elements as outlined above with reference to FIG. 1-12 may be used to generally transform a first (e.g., circular or linear) polarization distribution into a second (e.g., tangential) polarization distribution. To this, reference can be made, e.g., to the general configuration of FIG. 2d, i.e. with the optical crystal axes of all birefringent, elements 211-213 being perpendicular to the optical system axis, and with the optical crystal axis of the second element ca-2 being rotated around the optical system axis OA and with respect to the optical crystal axes ca-1 and ca-3 of the first and the second optical element by 45°. All three elements are again made of optically uniaxial material and may, e.g., be made of magnesium-fluoride ($MgF_2$).

Figure 15:
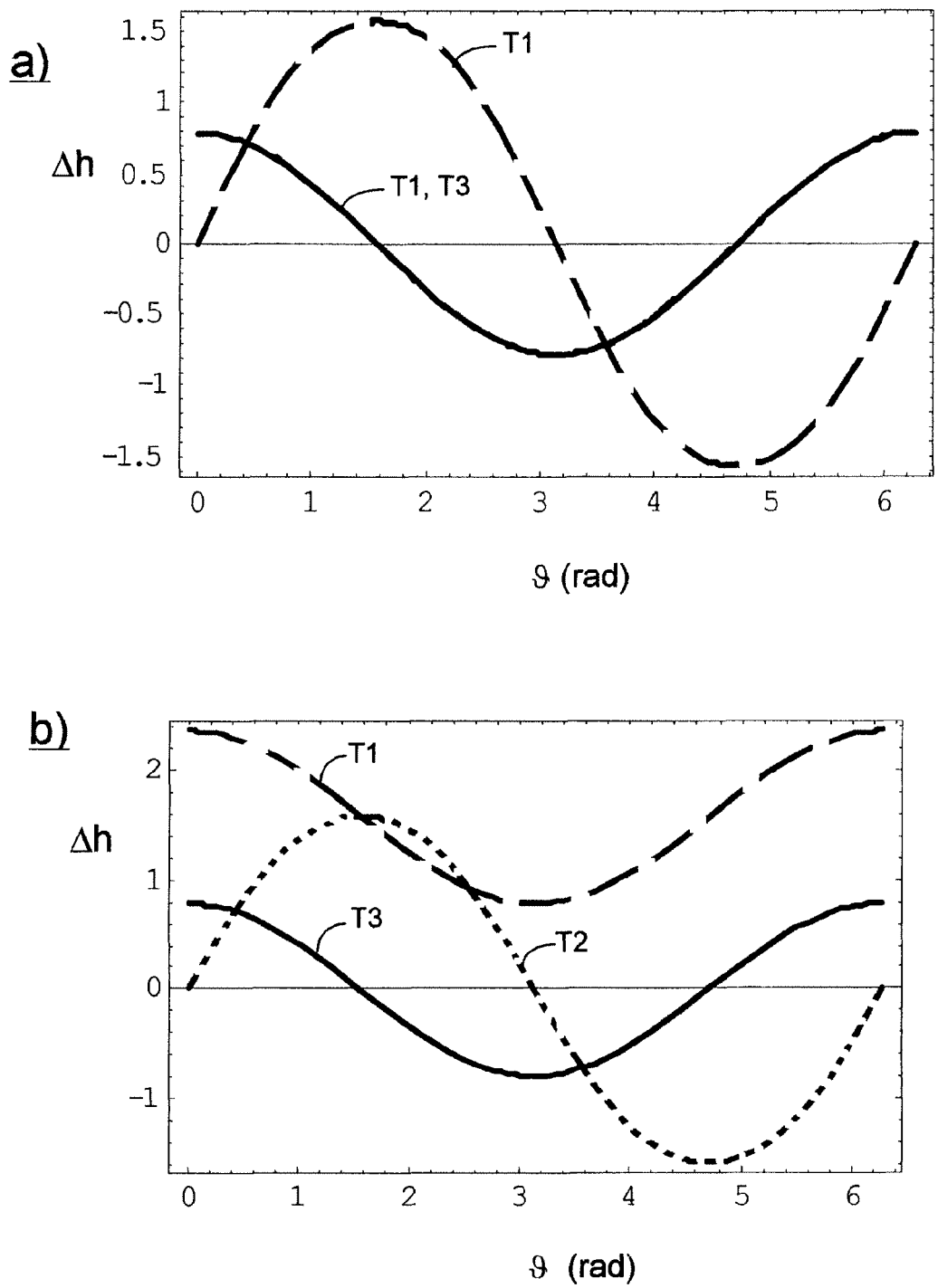
FIG. 15a-b show the retardation profile in radiant of each of the three optical elements in an element group that is used according to the disclosure to transform a circular polarization distribution (FIG. 15a) or linear polarization distribution (FIG. 15b) into a tangential polarization distribution as a function of the azimuth angle.

If the three birefringent elements of such a group have the retardation profiles illustrated in FIG. 15a, this element group may be used to transform a circular polarization distribution into a tangential polarization distribution. In FIGS. 15a and 15b, curve "T1" illustrates the retardation profile a function of the azimuth angle α for the first element 201, curve "T2" illustrates the retardation profile for the second element 202 and curve "T3" illustrates the retardation profile for the third element 203. The respective retardation profiles may be constant in the radial direction. If the three elements of the element group show the retardation profiles illustrated in FIG. 15b, this element group may be used to transform a linear polarization distribution into a tangential polarization distribution.

The above description of preferred embodiments has been given by way of example. A person skilled in the art will, however, not only understand the present disclosure and its advantages, but will also find suitable modifications thereof. Therefore, the present disclosure is intended to cover all such changes and modifications as far as falling within the spirit and scope of the disclosure as defined in the appended claims and the equivalents thereof.

TABLE 1

DESIGN DATA for FIG. 1
(NA = 1.55; wavelength λ = 193 nm)

| SURFACE | RADIUS | THICKNESS | MATERIAL | INDEX | SEMIDIAM. |
|---|---|---|---|---|---|
| 0 | 0.000000 | 52.291526 | | | 62.5 |
| 1 | 185.414915 | 36.606310 | SILUV | 1.560364 | 93.9 |
| 2 | −2368.330782 | 103.305956 | | | 94.5 |
| 3 | 1135.440971 | 81.730311 | SILUV | 1.560364 | 101.4 |
| 4 | −836.574481 | 7.626264 | | | 101.9 |
| 5 | 642.761068 | 10.166290 | SILUV | 1.560364 | 94.3 |
| 6 | −28777.509893 | 17.021812 | | | 92.4 |
| 7 | 374.784051 | 23.493394 | SILUV | 1.560364 | 88.9 |
| 8 | −739.574652 | 12.599110 | | | 86.7 |
| 9 | 0.000000 | 0.000000 | SILUV | 1.560364 | 82.0 |
| 10 | 0.000000 | 35.701682 | | | 82.0 |
| 11 | −287.062457 | 8.020868 | SILUV | 1.560364 | 87.6 |
| 12 | −260.605102 | 8.348886 | | | 89.8 |
| 13 | 356.037256 | 34.761348 | SILUV | 1.560364 | 102.3 |
| 14 | −1139.573155 | 45.988038 | | | 103.0 |
| 15 | −297.853763 | 10.898517 | SILUV | 1.560364 | 100.8 |
| 16 | −286.492576 | 442.012212 | | | 102.4 |
| 17 | −186.492728 | −232.661918 | REFL | | 162.7 |
| 18 | 213.357562 | 272.661219 | REFL | | 150.8 |
| 19 | 186.190755 | 63.407664 | SILUV | 1.560364 | 143.4 |
| 20 | 559.595962 | 102.212676 | | | 138.9 |
| 21 | 336.987586 | 10.146122 | SILUV | 1.560364 | 98.0 |
| 22 | 98.067417 | 59.917522 | | | 83.0 |
| 23 | 2014.227818 | 10.231531 | SILUV | 1.560364 | 83.9 |
| 24 | 209.706892 | 5.218396 | | | 88.7 |
| 25 | 187.199398 | 16.497859 | SILUV | 1.560364 | 90.5 |
| 26 | 563.378273 | 25.195888 | | | 92.4 |
| 27 | −358.535155 | 9.999385 | SILUV | 1.560364 | 95.4 |
| 28 | −369.270277 | 4.329131 | | | 104.5 |
| 29 | 6342.575536 | 49.942200 | SILUV | 1.560364 | 124.0 |
| 30 | −323.631832 | 0.997442 | | | 127.3 |
| 31 | −503.301175 | 35.880564 | SILUV | 1.560364 | 129.5 |
| 32 | −236.865310 | 0.997844 | | | 132.5 |
| 33 | −1601.468501 | 29.219759 | SILUV | 1.560364 | 133.0 |

TABLE 1-continued

DESIGN DATA for FIG. 1
(NA = 1.55; wavelength λ = 193 nm)

| SURFACE | RADIUS | THICKNESS | MATERIAL | INDEX | SEMIDIAM. |
|---|---|---|---|---|---|
| 34 | −298.758201 | 1.000000 | | | 134.0 |
| 35 | 808.661277 | 24.892404 | SILUV | 1.560364 | 130.1 |
| 36 | −2015.744411 | 1.000000 | | | 128.8 |
| 37 | 232.975060 | 41.179286 | SILUV | 1.560364 | 120.7 |
| 38 | 2382.195206 | 1.000000 | | | 116.6 |
| 39 | 192.288001 | 45.336304 | SILUV | 1.560364 | 110.2 |
| 40 | −1085.511304 | 1.000000 | | | 107.6 |
| 41 | 139.778134 | 25.996093 | SILUV | 1.560364 | 84.0 |
| 42 | 482.429105 | 1.000000 | | | 78.8 |
| 43 | 83.925256 | 60.000000 | LUAG | 2.143500 | 60.2 |
| 44 | 0.000000 | 3.100000 | HIINDEX | 1.650000 | 24.1 |
| 45 | 0.000000 | 0.000000 | | | 15.6 |

TABLE 2

ASPHERICAL CONSTANTS for FIG. 1

| | SRF | | | | |
|---|---|---|---|---|---|
| | 1 | 4 | 6 | 8 | 12 |
| K | 0 | 0 | 0 | 0 | 0 |
| C1 | −6.447148E−08 | −1.825065E−07 | 7.288539E−08 | 1.468587E−07 | −8.341858E−09 |
| C2 | 3.904192E−12 | 1.875167E−12 | 4.464300E−12 | −6.136079E−12 | 3.035481E−12 |
| C3 | −1.742805E−16 | 9.471479E−16 | −3.280221E−16 | −6.664138E−16 | 1.950958E−16 |
| C4 | −2.099949E−21 | −3.417617E−20 | −1.914887E−20 | −1.246213E−20 | 6.966650E−21 |
| C5 | 1.526611E−24 | −3.618274E−24 | 5.811541E−24 | 4.088277E−24 | 1.855444E−24 |
| C6 | −1.341115E−28 | 3.456865E−28 | −6.504073E−28 | 7.614765E−29 | −1.407831E−28 |
| C7 | 3.864081E−33 | −8.427102E−33 | 3.066152E−32 | −1.622968E−32 | −3.044932E−33 |

| | SRF | | | | |
|---|---|---|---|---|---|
| | 14 | 15 | 17 | 18 | 20 |
| K | 0 | 0 | −1.9096 | −0.5377 | 0 |
| C1 | −5.818454E−08 | −3.254341E−08 | −2.658999E−08 | −1.536262E−10 | −8.785831E−09 |
| C2 | −2.919573E−13 | 3.968952E−13 | 1.561056E−13 | −2.682680E−15 | 5.646919E−13 |
| C3 | −3.209102E−17 | −2.807842E−17 | −4.132973E−18 | −3.645198E−20 | −6.454482E−18 |
| C4 | 3.126755E−22 | 4.190647E−21 | 5.067872E−23 | 1.499409E−24 | −2.410154E−22 |
| C5 | 3.818902E−25 | −3.741144E−25 | −9.622504E−28 | 1.222432E−28 | 1.104073E−26 |
| C6 | −8.486242E−30 | 3.532694E−29 | 1.189984E−32 | −6.277586E−33 | −2.437139E−31 |
| C7 | −2.419178E−34 | −1.204525E−33 | −1.166383E−37 | 1.594458E−37 | 2.163229E−36 |

| | SRF | | | | |
|---|---|---|---|---|---|
| | 21 | 23 | 25 | 28 | 29 |
| K | 0 | 0 | 0 | 0 | 0 |
| C1 | 6.965245E−08 | −9.869141E−08 | −3.835477E−08 | 1.214957E−07 | 5.348537E−08 |
| C2 | −2.619816E−13 | 3.468310E−12 | −7.670508E−12 | 1.647962E−12 | 2.629539E−12 |
| C3 | 9.867326E−18 | −1.114544E−15 | 7.876676E−16 | −5.350727E−16 | −5.067530E−16 |
| C4 | −6.513277E−21 | 1.484338E−19 | −1.643323E−19 | 3.115581E−20 | 4.241183E−20 |
| C5 | 1.222326E−25 | −2.541221E−23 | 1.862076E−23 | −6.028858E−24 | −2.286931E−24 |
| C6 | −7.772178E−30 | 2.753259E−27 | −1.538795E−27 | 5.836667E−28 | 6.869266E−29 |
| C7 | −1.760691E−33 | −1.058751E−31 | 6.396967E−32 | −1.784413E−32 | −8.391190E−34 |

| | SRF | | | | | |
|---|---|---|---|---|---|---|
| | 31 | 33 | 36 | 38 | 40 | 42 |
| K | 0 | 0 | 0 | 0 | 0 | 0 |
| C1 | 3.570488E−09 | −1.108288E−08 | 1.098120E−08 | 3.498535E−09 | 4.009017E−08 | 6.190270E−09 |
| C2 | −2.899790E−13 | −5.556755E−13 | −8.319264E−13 | 1.277784E−12 | −5.714125E−12 | 1.866031E−11 |
| C3 | 1.081327E−16 | −3.884368E−18 | 3.311901E−17 | −7.357487E−17 | 6.202718E−16 | −3.186549E−15 |
| C4 | −1.172829E−20 | 1.842426E−21 | 7.733186E−23 | 1.115535E−21 | −5.344939E−20 | 5.219881E−19 |
| C5 | 2.404194E−25 | 3.001406E−27 | −1.051458E−26 | 2.894369E−25 | 3.354852E−24 | −6.008898E−23 |
| C6 | 1.461820E−29 | −7.804121E−30 | −4.556477E−30 | −1.579978E−29 | −1.359158E−28 | 4.502251E−27 |
| C7 | −5.103661E−34 | 2.042295E−34 | 1.779547E−34 | 3.499951E−34 | 2.690400E−33 | −1.632255E−31 |

TABLE 3

DESIGN DATA for FIG. 6
(NA = 1.55; wavelength λ = 193 nm)

| SURFACE | RADIUS | THICKNESS | MATERIAL | SEMIDIAMETER | TYP |
|---|---|---|---|---|---|
| 0 | 0.000000000 | 29.999023268 | AIR | 63.700 | |
| 1 | 0.000000000 | −0.022281351 | AIR | 74.345 | |
| 2 | 163.805749708 | 59.084774432 | SIO2V | 82.881 | |
| 3 | 105544.356800000 | 38.071845275 | AIR | 82.348 | |
| 4 | 101.870621340 | 65.572103284 | SIO2V | 82.073 | |
| 5 | −378.651946635 | 19.045416421 | AIR | 73.980 | |
| 6 | 370.653031677 | 12.447639670 | SIO2V | 52.927 | |
| 7 | −993.033551292 | 32.139483086 | AIR | 48.837 | |
| 8 | 0.000000000 | 9.999160574 | SIO2V | 56.110 | |
| 9 | 0.000000000 | 19.324564558 | AIR | 59.075 | |
| 10 | −192.850248976 | 9.999320401 | SIO2V | 63.500 | |
| 11 | −1410.323019430 | 0.999158407 | AIR | 71.319 | |
| 12 | 1101.723186800 | 39.051691649 | SIO2V | 76.269 | |
| 13 | −142.162593435 | 29.666310134 | AIR | 80.286 | |
| 14 | −374.506254334 | 22.829716703 | SIO2V | 88.413 | |
| 15 | −168.324621807 | 37.497577013 | AIR | 90.450 | |
| 16 | 0.000000000 | 230.203631062 | AIR | 95.221 | |
| 17 | −176.791197798 | −230.203631062 | AIR | 154.830 | REFL |
| 18 | 199.707895095 | 230.203631062 | AIR | 153.593 | REFL |
| 19 | 0.000000000 | 37.494077929 | AIR | 112.204 | |
| 20 | 154.146969466 | 37.014031773 | SIO2V | 108.045 | |
| 21 | 211.115292083 | 67.729859113 | AIR | 104.060 | |
| 22 | −417.157172821 | 9.999663284 | SIO2V | 87.647 | |
| 23 | 856.949969334 | 17.811529642 | AIR | 84.621 | |
| 24 | −461.630793169 | 9.999535405 | SIO2V | 83.829 | |
| 25 | 147.214334496 | 18.694156475 | AIR | 83.322 | |
| 26 | 188.563462966 | 13.376498541 | SIO2V | 86.613 | |
| 27 | 339.263859097 | 30.033832457 | AIR | 89.361 | |
| 28 | 55251.899029700 | 9.999840425 | SIO2V | 101.282 | |
| 29 | 324.218921543 | 11.074103655 | AIR | 110.546 | |
| 30 | 329.158897131 | 24.176827559 | SIO2V | 114.218 | |
| 31 | −1039.447544530 | 12.107569757 | AIR | 118.456 | |
| 32 | −1049.536733250 | 66.006337123 | SIO2V | 124.794 | |
| 33 | −161.348224543 | 0.998960784 | AIR | 130.266 | |
| 34 | −22578.425397200 | 19.907600934 | SIO2V | 142.663 | |
| 35 | −573.265324288 | 0.997820041 | AIR | 144.264 | |
| 36 | 272.154399646 | 74.960165499 | SIO2V | 152.983 | |
| 37 | −648.611591116 | −3.000147526 | AIR | 151.527 | |
| 38 | 0.000000000 | −0.362184752 | AIR | 144.818 | |
| 39 | 0.000000000 | 3.500000000 | AIR | 144.972 | |
| 40 | 0.000000000 | 0.017112000 | SAPHIR | 143.886 | UNIAXIAL |
| 41 | 0.000000000 | 0.017112000 | SAPHIR | 143.883 | UNIAXIAL |
| 42 | 0.000000000 | 0.017112000 | SAPHIR | 143.881 | UNIAXIAL |
| 43 | 0.000000000 | 0.017112000 | SAPHIR | 143.878 | UNIAXIAL |
| 44 | 0.000000000 | 0.017112000 | SAPHIR | 143.876 | UNIAXIAL |
| 45 | 0.000000000 | 0.017112000 | SAPHIR | 143.873 | UNIAXIAL |
| 46 | 0.000000000 | 6.904230000 | AIR | 143.871 | |
| 47 | 186.233344043 | 64.553742054 | SIO2V | 127.050 | |
| 48 | −817.629991875 | 1.838842051 | AIR | 122.346 | |
| 49 | 266.505780369 | 21.498553774 | SIO2V | 97.456 | |
| 50 | 1203.454749450 | 1.057097140 | AIR | 89.342 | |
| 51 | 92.026522503 | 72.367050294 | HINDSOL | 67.253 | CUBIC |
| 52 | 0.000000000 | 3.100206000 | HINDLIQ | 23.494 | |
| 53 | 0.000000000 | 0.000000000 | HINDLIQ | 15.959 | |

TABLE 4

ASPHERICAL CONSTANTS for FIG. 6

| SURFACE NR. | 2 |
|---|---|
| K | 0.0000 |
| C1 | 3.27717834e−008 |
| C2 | −4.89617715e−012 |
| C3 | 3.73996005e−016 |
| C4 | −2.37878831e−020 |
| C5 | 8.57925867e−025 |
| C6 | −9.04960217e−030 |
| C7 | 0.00000000e+000 |
| C8 | 0.00000000e+000 |
| C9 | 0.00000000e+000 |
| SURFACE NR. | 5 |
| K | 0.0000 |
| C1 | 6.50275226e−008 |
| C2 | 3.61801093e−012 |
| C3 | 1.02240864e−015 |
| C4 | −1.87353151e−019 |
| C5 | 8.82155787e−024 |
| C6 | −7.16445215e−029 |
| C7 | 0.00000000e+000 |
| C8 | 0.00000000e+000 |
| C9 | 0.00000000e+000 |
| SURFACE NR. | 7 |
| K | 0.0000 |
| C1 | 1.88065119e−007 |
| C2 | 1.92544339e−011 |

TABLE 4-continued

ASPHERICAL CONSTANTS for FIG. 6

| | | |
|---|---|---|
| C3 | 1.05639396e−014 | |
| C4 | −3.85644447e−018 | |
| C5 | 1.76463375e−021 | |
| C6 | −2.78164496e−026 | |
| C7 | 0.00000000e+000 | |
| C8 | 0.00000000e+000 | |
| C9 | 0.00000000e+000 | |
| SURFACE NR. | 11 | |
| K | 0.0000 | |
| C1 | −6.13052340e−008 | |
| C2 | −7.27041902e−013 | |
| C3 | −2.98818117e−016 | |
| C4 | 4.72904649e−021 | |
| C5 | −3.26324829e−025 | |
| C6 | 9.20302500e−030 | |
| C7 | 0.00000000e+000 | |
| C8 | 0.00000000e+000 | |
| C9 | 0.00000000e+000 | |
| SURFACE NR. | 15 | |
| K | 0.0000 | |
| C1 | 1.81116410e−008 | |
| C2 | 1.46342750e−012 | |
| C3 | 9.16966554e−017 | |
| C4 | 2.17610192e−021 | |
| C5 | 3.66548751e−025 | |
| C6 | −1.09508590e−029 | |
| C7 | 0.00000000e+000 | |
| C8 | 0.00000000e+000 | |
| C9 | 0.00000000e+000 | |
| SURFACE NR. | 17 | |
| K | −1.4693 | |
| C1 | −2.06488339e−008 | |
| C2 | 1.16939811e−014 | |
| C3 | −1.28854467e−018 | |
| C4 | −2.18667724e−024 | |
| C5 | −2.11424143e−029 | |
| C6 | −2.63669751e−033 | |
| C7 | 0.00000000e+000 | |
| C8 | 0.00000000e+000 | |
| C9 | 0.00000000e+000 | |
| SURFACE NR. | 18 | |
| K | −1.4756 | |
| C1 | 1.81134384e−008 | |
| C2 | 4.18803124e−014 | |
| C3 | 1.13727194e−018 | |
| C4 | 1.05429895e−023 | |
| C5 | −7.51318112e−029 | |
| C6 | 5.73990187e−033 | |
| C7 | 0.00000000e+000 | |
| C8 | 0.00000000e+000 | |
| C9 | 0.00000000e+000 | |
| SURFACE NR. | 21 | |
| K | 0.0000 | |
| C1 | −6.50775113e−008 | |
| C2 | −1.42875005e−012 | |
| C3 | 2.44348063e−017 | |
| C4 | 2.69349478e−021 | |
| C5 | −6.45183994e−026 | |
| C6 | −1.06542172e−030 | |
| C7 | 0.00000000e+000 | |
| C8 | 0.00000000e+000 | |
| C9 | 0.00000000e+000 | |
| SURFACE NR. | 22 | |
| K | 0.0000 | |
| C1 | 3.25656570e−008 | |
| C2 | −9.80151934e−012 | |
| C3 | 4.72663722e−016 | |
| C4 | −3.37084211e−020 | |
| C5 | 5.44443713e−024 | |
| C6 | −2.69886851e−028 | |
| C7 | 0.00000000e+000 | |
| C8 | 0.00000000e+000 | |
| C9 | 0.00000000e+000 | |
| SURFACE NR. | 26 | |
| K | 0.0000 | |
| C1 | −1.25873172e−007 | |
| C2 | 5.07729011e−013 | |
| C3 | −4.31596804e−016 | |
| C4 | 3.40710175e−020 | |
| C5 | −1.09371424e−024 | |
| C6 | 7.19441882e−029 | |
| C7 | 0.00000000e+000 | |
| C8 | 0.00000000e+000 | |
| C9 | 0.00000000e+000 | |
| SURFACE NR. | 29 | |
| K | 0.0000 | |
| C1 | −1.84342902e−008 | |
| C2 | 2.53638171e−012 | |
| C3 | −5.99368498e−016 | |
| C4 | 3.86624579e−020 | |
| C5 | −1.20898381e−024 | |
| C6 | 8.96652964e−030 | |
| C7 | 0.00000000e+000 | |
| C8 | 0.00000000e+000 | |
| C9 | 0.00000000e+000 | |
| SURFACE NR. | 30 | |
| K | 0.0000 | |
| C1 | −8.61879968e−008 | |
| C2 | 3.39493867e−012 | |
| C3 | −3.28195033e−016 | |
| C4 | 2.10606123e−020 | |
| C5 | −1.04723087e−024 | |
| C6 | 2.62244522e−029 | |
| C7 | 0.00000000e+000 | |
| C8 | 0.00000000e+000 | |
| C9 | 0.00000000e+000 | |
| SURFACE NR. | 32 | |
| K | 0.0000 | |
| C1 | −1.37987785e−008 | |
| C2 | 9.93396958e−013 | |
| C3 | −6.33630634e−017 | |
| C4 | −8.67433197e−022 | |
| C5 | 2.93215222e−025 | |
| C6 | −1.28960244e−029 | |
| C7 | 0.00000000e+000 | |
| C8 | 0.00000000e+000 | |
| C9 | 0.00000000e+000 | |
| SURFACE NR. | 34 | |
| K | 0.0000 | |
| C1 | −2.99481436e−008 | |
| C2 | 1.36597095e−013 | |
| C3 | 1.91457881e−017 | |
| C4 | 3.73289075e−022 | |
| C5 | 2.97027585e−026 | |
| C6 | −1.84061701e−030 | |
| C7 | 0.00000000e+000 | |
| C8 | 0.00000000e+000 | |
| C9 | 0.00000000e+000 | |
| SURFACE NR. | 37 | |
| K | 0.0000 | |
| C1 | −4.09482708e−009 | |
| C2 | −1.82941742e−013 | |
| C3 | 2.20416868e−017 | |
| C4 | 6.34184593e−024 | |
| C5 | −2.87479049e−026 | |
| C6 | 4.96786571e−031 | |
| C7 | 0.00000000e+000 | |
| C8 | 0.00000000e+000 | |
| C9 | 0.00000000e+000 | |
| SURFACE NR. | 48 | |
| K | 0.0000 | |
| C1 | 2.74613205e−008 | |
| C2 | −6.95594493e−013 | |
| C3 | −7.38008203e−017 | |
| C4 | 1.06403973e−020 | |
| C5 | −4.67997489e−025 | |
| C6 | 8.19502507e−030 | |
| C7 | 0.00000000e+000 | |
| C8 | 0.00000000e+000 | |
| C9 | 0.00000000e+000 | |
| SURFACE NR. | 50 | |
| K | 0.0000 | |
| C1 | 3.61747962e−008 | |
| C2 | 4.73189475e−012 | |
| C3 | −9.39579701e−018 | |
| C4 | 1.36373597e−021 | |

TABLE 4-continued

ASPHERICAL CONSTANTS for FIG. 6

| | |
|---|---|
| C5 | 4.58112541e−025 |
| C6 | 2.49231914e−029 |
| C7 | 0.00000000e+000 |
| C8 | 0.00000000e+000 |
| C9 | 0.00000000e+000 |

TABLE 5

Coefficients for Zernike polynomial-terms for free-form surfaces of FIG. 9

| Surface | Specifications and Birefringence data | | |
|---|---|---|---|
| 41 | ZP2: 1.3464E−04 | ZP6: 7.0720E−03 | ZP7: −3.0436E−04 |
| | ZP8: −8.6148E−05 | ZP14: −2.7788E−03 | ZP15: 9.9238E−05 |
| | ZP16: 1.6627E−04 | ZP17: 9.6187E−05 | ZP18: 1.6835E−04 |
| | ZP26: 7.2238E−04 | ZP27: −5.4027E−05 | ZP31: −8.2896E−05 |
| | ZP32: 9.2226E−05 | ZP42: −1.3009E−04 | ZP50: 2.2443E−05 |
| | NRADIUS: 1.4442E+02 | | |
| | BIREFRINGENCE: −0.01130 | | |
| | CRYSTAL AXIS: 0.707107 −0.707107 0.000000 | | |
| 42 | BIREFRINGENCE: −0.01130 | | |
| | CRYSTAL AXIS: 0.000000 1.000000 0.000000 | | |
| 43 | ZP1: −2.2103E−05 | ZP3: 3.1465E−05 | ZP4: −2.6569E−03 |
| | ZP5: 1.2076E−05 | ZP9: −2.0832E−04 | ZP10: 2.4878E−04 |
| | ZP11: −1.1947E−04 | ZP12: 2.2720E−03 | ZP13: −4.8980E−05 |
| | ZP19: −1.6463E−05 | ZP20: 2.6678E−04 | ZP21: 1.2347E−04 |
| | ZP23: −1.0043E−04 | ZP24: −7.8608E−04 | ZP25: −4.9355E−05 |
| | ZP33: −8.3815E−05 | ZP34: 2.9550E−04 | ZP40: 6.6448E−04 |
| | ZP41: −3.2893E−05 | ZP51: −8.6576E−05 | ZP61: −1.4676E−06 |
| | NRADIUS: 1.4437E+02 | | |
| | BIREFRINGENCE: −0.01130 | | |
| | CRYSTAL AXIS: 1.000000 0.000000 0.000000 | | |
| 44 | BIREFRINGENCE: −0.01130 | | |
| | CRYSTAL AXIS: 0.707107 0.707107 0.000000 | | |
| 45 | ZP2: 9.9565E−05 | ZP6: 7.1135E−03 | ZP7: −5.2388E−04 |
| | ZP8: −1.9099E−04 | ZP14: −2.7880E−03 | ZP15: 5.6141E−05 |
| | ZP16: −1.2722E−04 | ZP17: 1.0277E−04 | ZP18: −2.1371E−04 |
| | ZP26: 6.8543E−04 | ZP27: −1.0003E−04 | ZP31: −5.4322E−06 |
| | ZP32: −2.5020E−04 | ZP42: −1.4399E−04 | ZP50: −1.2186E−04 |
| | NRADIUS: 1.4433E+02 | | |
| | BIREFRINGENCE: −0.01130 | | |
| | CRYSTAL AXIS: 0.707107 −0.707107 0.000000 | | |
| 51 | INTRINSIC BIREFRINGENCE 0.3010E−05 | | |
| | CUBIC AXIS ORIENTATION: Y: 0.707107 0.707107 0.000000 | | |
| | Z: −0.707107 0.707107 0.000000 | | |

The invention claimed is:

1. An optical system having an optical system axis, the optical system comprising:
at least one element group comprising first, second and third birefringent elements each of which comprise optically uniaxial material and have an aspheric surface, wherein:
the first birefringent element of the group has an optical crystal axis with a first orientation;
the second birefringent element has an optical crystal axis with a second orientation rotated relative to the first orientation by an angle that does not correspond to a rotation around the optical system axis by an angle of 90° or an integer multiple thereof;
the third birefringent element of the group has an optical crystal axis with a third orientation rotated relative to the second orientation by an angle that does not correspond to a rotation around the optical system axis by an angle of 90° or an integer multiple thereof; and
the optical system is an illumination system of a microlithographic exposure system or a projection lens of a microlithographic exposure system, wherein each birefringent element has a variation of its thickness profile so that a minimum phase retardation of $\Delta\phi min \approx 25$ mrad is obtained at a given operating wavelength of the optical system.

2. The optical system according to claim 1, wherein the optical crystal axes of the three birefringent elements are oriented different from each other.

3. The optical system according to claim 1, wherein the optical crystal axes of the first birefringent element and the third birefringent element are substantially parallel to each other.

4. The optical system according to claim 1, wherein the optical crystal axis of each of the first, second and third birefringent elements is either perpendicular or parallel to the optical system axis.

5. The optical system according to claim 1, wherein the optical crystal axis of one of the birefringent elements is substantially parallel to the optical system axis, and the optical crystal axes of the remaining two birefringent elements are substantially perpendicular to the optical system axis and rotated to each other around the optical system axis by an angle in the range of 30° to 60°.

6. The optical system according to claim 1, wherein the optical crystal axes of the birefringent elements are perpendicular to the optical system axis, and the optical crystal axis of the first birefringent element and the optical crystal axis of the third birefringent element are each rotated around the optical system axis with respect to the optical crystal axis of the second birefringent element by an angle in the range of 30° to 60°.

7. The optical system according to claim 1, wherein one or two of the birefringent elements have an optical crystal axis which is substantially perpendicular to the optical system axis, and wherein the other birefringent element(s) of the group have a optical crystal axis which is substantially parallel to the optical system axis.

8. The optical system according to claim 7, wherein the birefringent element(s) of the group having an optical crystal axis which is substantially parallel to the optical system axis comprise an optically active material.

9. The optical system according to claim 1, wherein a birefringent material of at least one of the birefringent elements is selected from the group consisting of magnesium-fluoride ($MgF_2$), lanthanum-fluoride ($LaF_3$), sapphire ($Al_2O_3$) and crystalline quartz ($SiO_2$).

10. The optical system according to claim 1, wherein at least two of the elements are united to provide a combined element.

11. The optical system according to claim 10, wherein the combined element or the element group is arranged at a position where the relation $$0.8 < \frac{D_1}{D_2} < 1.0$$

is met, with $D_1$ being a diameter of a light bundle at the position and $D_2$ being a total optically used diameter at the position.

12. The optical system according to claim 10, wherein the optical system comprises an additional combined element comprising at least two united elements, each of the combined elements being arranged at a position where the relation $$0.5 \le \frac{D_1}{D_2} \le 1.0$$

is met, with $D_1$ being a diameter of a light bundle at the respective position and $D_2$ being a total optically used diameter at the respective position.

13. The optical system according to claim 1, wherein the element group has a maximum axial length along the optical system axis that is not more than 50% of an average optically effective diameter of the element group.

14. The optical system according to claim 13, wherein:
at least two of the elements are united to provide a combined element, and
the combined element or the element group is arranged in a pupil plane of the optical system.

15. The optical system according to claim 1, wherein the birefringent elements have on average essentially no refracting power.

16. The optical system according to claim 1, wherein at least one of the aspheric surfaces is arranged at least near a pupil plane of the optical system.

17. The optical system according to claim 16, wherein the pupil plane of the optical system is a first pupil plane along a light propagation direction of the optical system.

18. The optical system according to claim 1, wherein the optical system comprises at least two of the element groups.

19. The optical system according to claim 1, wherein the optical system comprises two element groups, each of the element groups being arranged at a position where the relation $$0.5 \le \frac{D_1}{D_2} \le 1.0$$

is met, with $D_1$ being a diameter of a light bundle at the respective position and $D_2$ being a total optically used diameter at the respective position.

20. An optical system having an optical system axis, the optical system comprising:
at least one element group comprising first, second and third birefringent elements each of which comprise optically uniaxial material and have an aspheric surface, wherein:
the first birefringent element of the group has an optical crystal axis with a first orientation;
the second birefringent element has an optical crystal axis with a second orientation rotated relative to the first orientation by an angle that does not correspond to a rotation around the optical system axis by an angle of 90° or an integer multiple thereof;
the third birefringent element of the group has an optical crystal axis with a third orientation rotated relative to the second orientation by an angle that does not correspond to a rotation around the optical system axis by an angle of 90° or an integer multiple thereof;
a fourth optical element configured to cause a disturbance of the distribution of polarization over the cross section of a light beam, wherein the aspheric surfaces of the birefringent elements are selected such that the disturbance of the distribution of polarization is at least partially compensated, and the optical system is an illumination system of a microlithographic exposure system or a projection lens of a microlithographic exposure system.

21. The optical system according to claim 20, wherein the distribution of polarization caused by the fourth optical element has a k-fold symmetry around the optical system axis, and the aspheric surfaces of the birefringent elements of the element group have at least one mirror symmetry axis.

22. The optical system according to claim 20, wherein the distribution of polarization caused by the fourth optical element has a 4-fold symmetry around the optical system axis, and the aspheric surface of the at least one birefringent element of the group has two mirror symmetry axes.

23. The optical system according to claim 20, wherein the fourth optical element is configured to cause a disturbance of the distribution of polarization over the cross section of a light beam comprises a cubic crystal material providing a birefringence magnitude of at least 10 nm/cm at an operating wavelength of 193 nm.

24. The optical system according to claim 20, wherein the fourth optical element is a (100)-cubic crystal-lens or a (111)-cubic-crystal-lens.

25. The optical system according to claim 20, wherein the fourth optical element comprises a spinelle.

26. The optical system according to claim 20, wherein the fourth optical element comprises a first lens component embedded in a second lens component, and the second lens component comprises an optically isotropic material.

27. The optical system according to claim 26, wherein the first lens component comprises a crystal material providing a retardation of at least 10 nm/cm at an operating wavelength of 193 nm.

28. The optical system according to claim 26, wherein the first lens component comprises a crystal material with a refractive index larger than 1.7 at an operating wavelength of 193 nm.

29. The optical system according to claim 26, wherein the crystal material of the first lens component is an optically uniaxial material.

30. The optical system according to claim 29, wherein the optically uniaxial material is selected from the group consisting of magnesium-fluoride ($MgF_2$), lanthanum-fluoride ($LaF_3$), sapphire ($Al_2O_3$) and crystalline quartz ($SiO_2$).

31. The optical system according to claim 26, wherein the crystal material of the first lens component is a cubic crystal material.

32. The optical system according to claim 31, wherein the crystal material of the first lens component comprises spinelle.

33. The optical system according to claim 26, wherein the second lens component is a meniscus lens and the first lens component is arranged at a concave light exit side of the meniscus lens to form a substantially plan-convex lens together with the second lens component.

34. An optical system having an optical system axis, the optical system comprising:
at least one element group comprising first, second and third birefringent elements each of which comprise optically uniaxial material and have an aspheric surface, wherein:
the first birefringent element of the group has an optical crystal axis with a first orientation;
the second birefringent element has an optical crystal axis with a second orientation rotated relative to the first orientation by an angle that does not correspond to a rotation around the optical system axis by an angle of 90° or an integer multiple thereof;

the third birefringent element of the group has an optical crystal axis with a third orientation rotated relative to the second orientation by an angle that does not correspond to a rotation around the optical system axis by an angle of 90° or an integer multiple thereof; and the optical system is an illumination system of a microlithographic exposure system or a projection lens of a microlithographic exposure system, wherein a gap between at least two of the birefringent elements is at least partially filled with a liquid having a refraction index that differs not more that 30% of the refraction indices of the two birefringent elements.

35. The optical system according to claim 34, wherein the birefringent elements comprise magnesium-fluoride ($MgF_2$), and a gap between at least two of the birefringent elements is at least partially filled with water ($H_2O$).

* * * * *

UNITED STATES PATENT AND TRADEMARK OFFICE
CERTIFICATE OF CORRECTION

| | |
|---|---|
| PATENT NO. | : 8,031,326 B2 |
| APPLICATION NO. | : 12/042621 |
| DATED | : October 4, 2011 |
| INVENTOR(S) | : Michael Totzeck et al. |

It is certified that error appears in the above-identified patent and that said Letters Patent is hereby corrected as shown below:

In the Specifications:

Column 3, Line 4, delete "pre-sent" insert --present--;

Column 9, Line 31, delete "[100]" insert --[100]- --;

Column 10, Line 42, delete "m)" insert --nm)--;

Column 14, Lines 27-36, delete "Furthermore, as can be seen in Fig. 8a..., and all six plates 651a-653b can be made of the same optically uniaxial material, e.g., $Al_2O_3$, $MgF_2$ or $LaF_3$." insert same as new paragraph at Line 28;

Column 15, Line 38, delete "$R^2cos$" insert --$R^2 \cdot \cos$--;

Column 16, Line 20, delete "10" insert --12--;

Column 18, Line 16, delete "α" insert --θ--;

In the Claims:

Column 27, Line 22, Claim 15, delete "on" insert --an--.

Signed and Sealed this
Seventh Day of August, 2012

David J. Kappos
*Director of the United States Patent and Trademark Office*